United States Patent
Lakatos et al.

(10) Patent No.: US 10,969,248 B2
(45) Date of Patent: Apr. 6, 2021

(54) CAPACITIVE SENSING AND HEATING SYSTEM FOR STEERING WHEELS OR SEATS TO SENSE PRESENCE OF HAND OF OCCUPANT ON STEERING WHEEL OR OCCUPANT IN SEAT

(71) Applicant: Gentherm Incorporated, Northville, MI (US)

(72) Inventors: Robert Lakatos, Pilisszentiván (HU); Peter Marton, Budakalasz (HU); Jack Barfuss, Windsor (CA); Daniel Wei Li Cheah, Windsor (CA); Ricardo Edmundo Flores Gonzalez, Novi, MI (US); Michael Maass, Ypsilanti, MI (US); Tim Normand, Lasalle (CA); Gerardo Edel de la Garza Fernandez, Ciudad Acuña Coahuila (MX)

(73) Assignee: Gentherm Inc., Northville, MI (US)

( * ) Notice: Subject to any disclaimer, the term of this patent is extended or adjusted under 35 U.S.C. 154(b) by 147 days.

(21) Appl. No.: 16/256,078

(22) Filed: Jan. 24, 2019

(65) Prior Publication Data

US 2019/0226879 A1    Jul. 25, 2019

Related U.S. Application Data

(60) Provisional application No. 62/621,323, filed on Jan. 24, 2018.

(51) Int. Cl.
*G01D 5/24* (2006.01)
*G01V 3/08* (2006.01)
(Continued)

(52) U.S. Cl.
CPC ............ *G01D 5/24* (2013.01); *B60K 35/00* (2013.01); *B60K 37/06* (2013.01); *B60N 2/002* (2013.01);
(Continued)

(58) Field of Classification Search
CPC .... G01D 5/24; B60R 21/01532; B60K 35/00; B60K 37/06; B60K 2370/48;
(Continued)

(56) References Cited

U.S. PATENT DOCUMENTS 6,091,376 A  *  7/2000  Takekawa ............ B60K 35/00
                                                      345/7
7,019,623 B2    3/2006  Klausner et al.
(Continued)

FOREIGN PATENT DOCUMENTS

CN       104276201 A      1/2015
DE       19724168 C1  *  8/1998 ............ B60N 2/002
(Continued)

OTHER PUBLICATIONS

Translation of DE 19724168 (Year: 1998).*
(Continued)

*Primary Examiner* — Christopher P McAndrew

(57) ABSTRACT

A capacitance measuring system detecting an occupant of a vehicle. A sensor/heater assembly is arranged in at least one of a seat or a steering wheel of a vehicle and includes a sensor and a heater arranged adjacent to the sensor. A measurement circuit is configured to output an excitation signal to the measurement circuit and the sensor/heater assembly, measure a resonant frequency of the measurement circuit and the sensor/heater assembly in response to the excitation signal; determine at least one capacitance value based on the resonant frequency; and determine whether a body part is in proximity to the sensor based on the at least one capacitance value.

20 Claims, 18 Drawing Sheets

(51) Int. Cl.
*B60N 2/00* (2006.01)
*B62D 1/06* (2006.01)
*B60N 2/56* (2006.01)
*B60R 21/015* (2006.01)
*B60K 35/00* (2006.01)
*B62D 1/04* (2006.01)
*H03K 17/955* (2006.01)
*H03K 17/95* (2006.01)
*B60K 37/06* (2006.01)

(52) U.S. Cl.
CPC ......... *B60N 2/5678* (2013.01); *B60N 2/5685* (2013.01); *B60R 21/01532* (2014.10); *B62D 1/046* (2013.01); *B62D 1/065* (2013.01); *G01V 3/08* (2013.01); *H03K 17/954* (2013.01); *H03K 17/955* (2013.01); *B60K 2370/143* (2019.05); *B60K 2370/48* (2019.05); *B60K 2370/782* (2019.05)

(58) Field of Classification Search
CPC ........ B60K 2370/782; B60K 2370/143; B62D 1/046; B62D 1/065; H03K 17/955; H03K 17/954; B60N 2/5685; B60N 2/002; B60N 2/5678; G01V 3/08
USPC ........................................................ 324/601
See application file for complete search history.

(56) References Cited

U.S. PATENT DOCUMENTS

| | | | |
|---|---|---|---|
| 7,098,674 B2 | 8/2006 | Stanley et al. | |
| 7,109,862 B2 | 9/2006 | Braeuchle et al. | |
| 7,838,804 B2 | 11/2010 | Krobok | |
| 8,095,270 B2 | 1/2012 | Bossier et al. | |
| 8,970,231 B2 | 3/2015 | Kandler | |
| 9,000,331 B2 | 4/2015 | Virnich et al. | |
| 9,007,190 B2 | 4/2015 | Bosch et al. | |
| 9,132,850 B2 | 9/2015 | Virnich et al. | |
| 9,266,454 B2 | 2/2016 | Barfuss et al. | |
| 9,658,266 B2 | 5/2017 | Petereit et al. | |
| 9,701,232 B2 | 7/2017 | Barfuss et al. | |
| 9,726,775 B2 | 8/2017 | Lamesch | |
| 9,821,832 B2 | 11/2017 | Davignon et al. | |
| 2006/0261672 A1* | 11/2006 | Richter | B60R 21/01516 307/10.1 |
| 2008/0116904 A1* | 5/2008 | Reynolds | G06F 3/04166 324/678 |
| 2009/0008377 A1* | 1/2009 | Nathan | B60N 2/5685 219/217 |
| 2010/0231239 A1 | 9/2010 | Tateishi et al. | |
| 2011/0190980 A1 | 8/2011 | Kincaid | |
| 2012/0112767 A1* | 5/2012 | Nonogaki | H03K 17/955 324/633 |
| 2013/0277351 A1* | 10/2013 | Lamesch | B60R 21/015 219/202 |
| 2015/0330931 A1 | 11/2015 | Fujikawa et al. | |
| 2015/0369633 A1 | 12/2015 | Karasawa et al. | |
| 2016/0101805 A1 | 4/2016 | Nishio et al. | |
| 2016/0150593 A1 | 5/2016 | Barfuss et al. | |
| 2017/0079089 A1 | 3/2017 | Okazaki et al. | |
| 2017/0129499 A1 | 5/2017 | Odate | |
| 2017/0137050 A1 | 5/2017 | Michelmann et al. | |
| 2017/0166236 A1 | 6/2017 | Iguchi et al. | |
| 2017/0183025 A1 | 6/2017 | Okazaki et al. | |
| 2017/0210408 A1 | 7/2017 | Okazaki et al. | |
| 2017/0254675 A1 | 9/2017 | Hein et al. | |
| 2018/0042499 A1* | 2/2018 | Sato | A61B 5/02125 |

FOREIGN PATENT DOCUMENTS

| | | |
|---|---|---|
| DE | 102009058138 A1 | 6/2011 |
| DE | 102014117823 A1 | 6/2016 |
| DE | 102016201406 A1 | 8/2017 |
| EP | 2572929 A1 | 3/2013 |
| JP | 2016165940 A | 9/2016 |
| JP | 2016190570 A | 11/2016 |
| JP | 2016193668 A | 11/2016 |
| JP | 2017004795 A | 1/2017 |
| JP | 2017024603 A | 2/2017 |
| TW | 201512005 A | 4/2015 |

OTHER PUBLICATIONS

International Search Report and Written Opinion dated Jul. 18, 2019 corresponding to International Application No. PCT/US2019/014939, 12 pages.

Analog Devices, Inc.; "Programmable Controller for Capacitance Touch Sensors Data Sheet (Rev. 0)"; AD7143; 2007; 57 pages.

PICOCAP; Acam-Messelectronic Gmbh; "PCap02A Single-chip Solution for Capacitance Measurement vol. 1: General Data and Front-end Description; Document No. DB_PCap02A_Vol1_en.pdf"; Version 1.6; May 29, 2014; 85 pages.

PICOCAP; Acam-Messelectronic Gmbh; "PCap02Ax DSP Single Chip Solution for Capacitance Measurement vol. 2: Digital Signal Processor"; Version 0.2; Aug. 16, 2013; 69 pages.

Texas Instruments; "FDC1004Q 4-Channel Capacitance-to-Digital Converter for Capacitive Sensing Solutions"; Apr. 2015; 29 pages.

Texas Instruments; "FDC2112-Q1, FDC2114Q1, FDC2212-Q1, FDC2214-Q1 Multi-Channel 12-Bit or 28-Bit Capacitance-to-Digital Converter (FDC) for Capacitive Sensing"; May 2016; 60 pages.

* cited by examiner

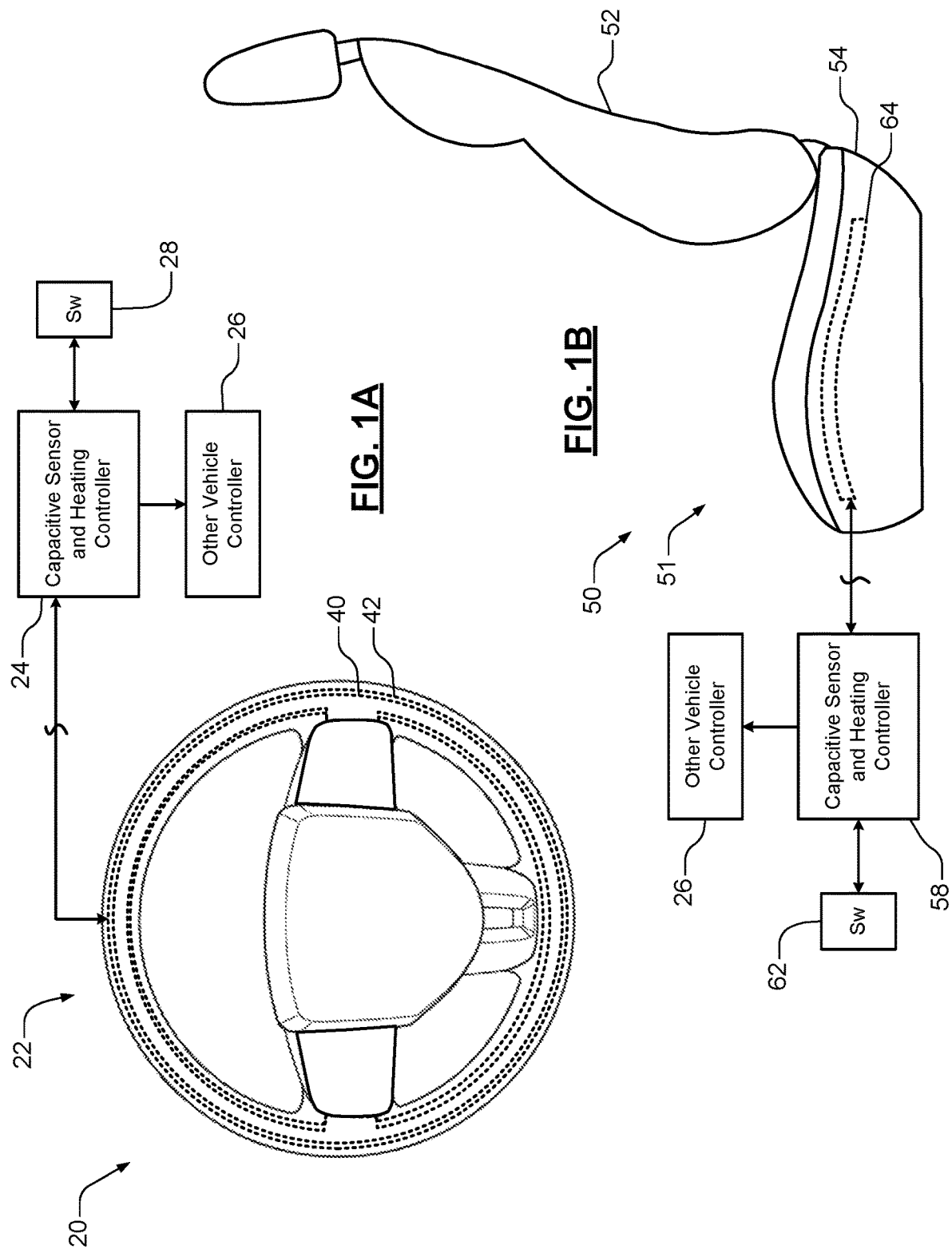

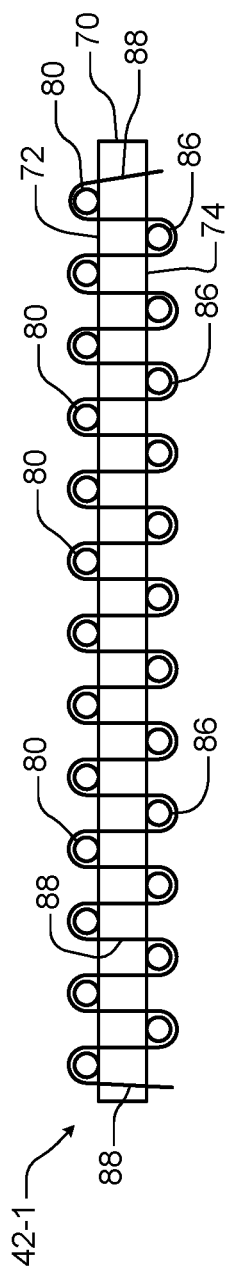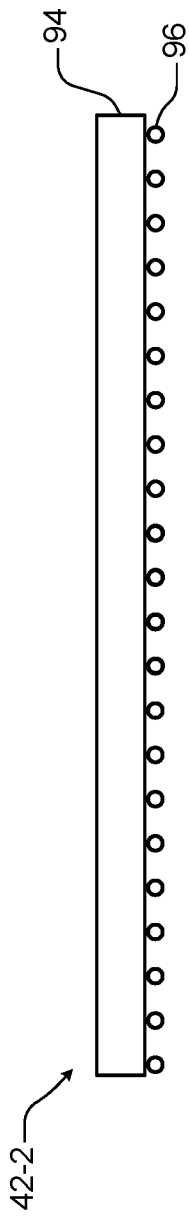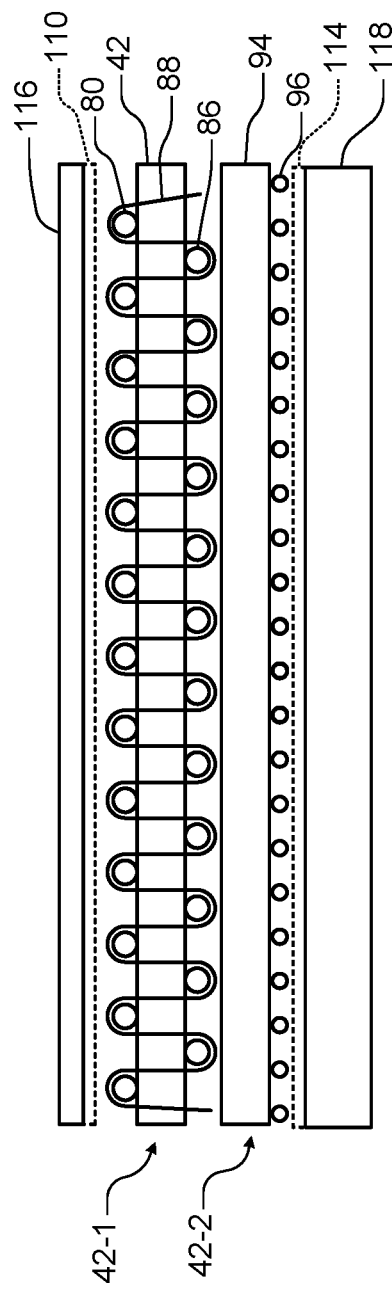

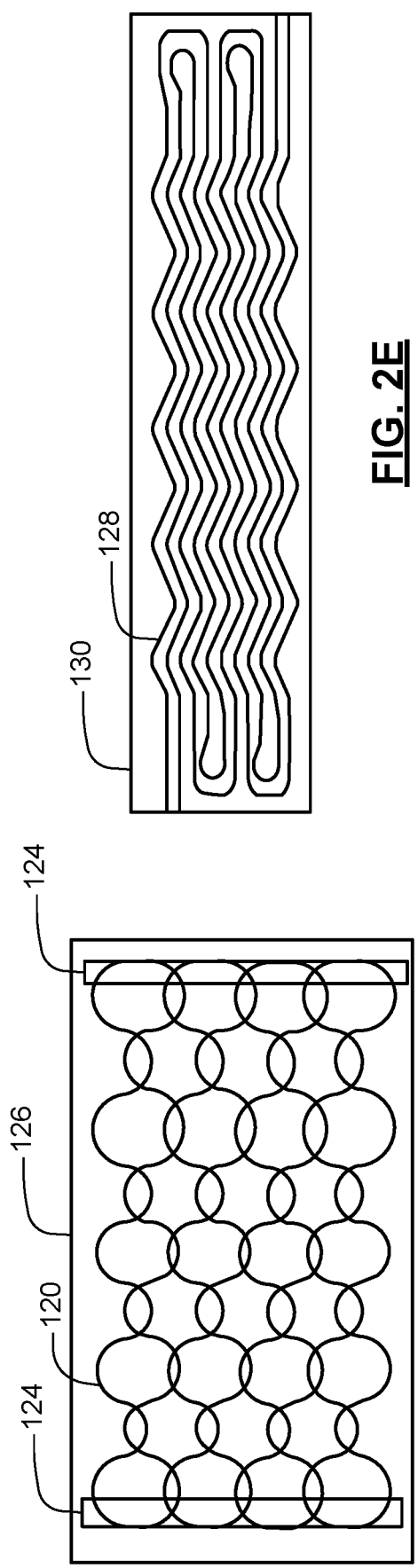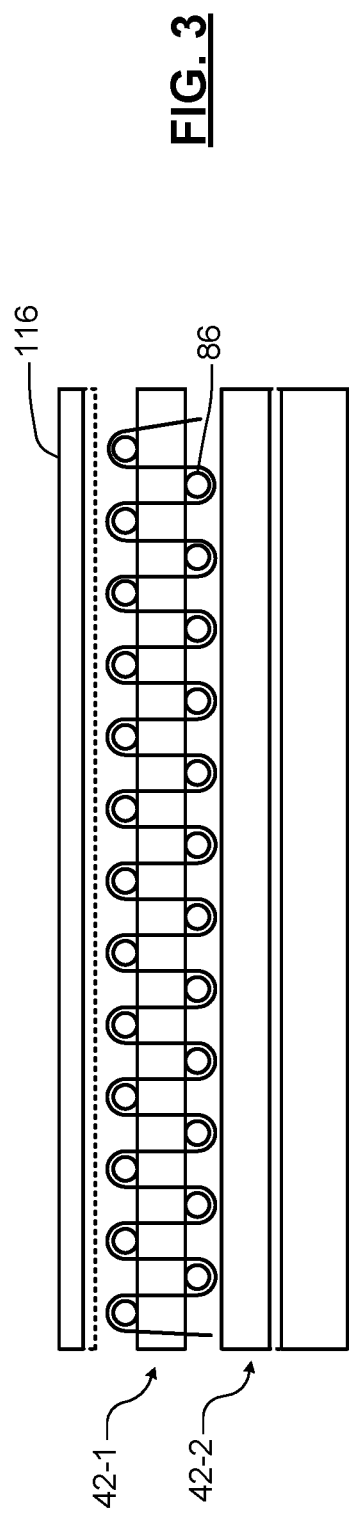

CAPACITIVE SENSING AND HEATING SYSTEM FOR STEERING WHEELS OR SEATS TO SENSE PRESENCE OF HAND OF OCCUPANT ON STEERING WHEEL OR OCCUPANT IN SEAT

CROSS-REFERENCE TO RELATED APPLICATIONS

This application claims the benefit of U.S. Provisional Application No. 62/621,323, filed on Jan. 24, 2018. The entire disclosures of the application referenced above is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

Vehicles such as partially or fully autonomous vehicles may include an autonomous vehicle control system that automatically controls driving of the vehicle when certain conditions are present. The autonomous vehicle control systems typically include a navigation system, an array of external sensors such as radar or lidar sensors and actuators that control steering, braking and acceleration of the vehicle.

For partially autonomous vehicles, certain driving situations may require a driver to intervene and/or take over driving of the vehicle. For example, driving on a highway may be handled by the autonomous vehicle control system. Driver intervention may be requested in the event of an accident or construction on the roadway or when the vehicle starts exiting the highway. As a result, the vehicles will likely need to sense whether or not the occupant's hand or hands are on a steering wheel of the vehicle prior to disengagement of the vehicle control system.

Sensors located in seats of the vehicle may also be used to detect the presence or absence of an occupant of the vehicle and/or to estimate a weight of the occupant. Based on the presence and/or weight of the occupant, safety restraints such as air bags and seat belt pretensioners may be selectively enabled or disabled.

SUMMARY

A capacitance measuring system detecting an occupant of a vehicle. A sensor/heater assembly is arranged in at least one of a seat or a steering wheel of a vehicle and includes a sensor and a heater arranged adjacent to the sensor. A measurement circuit is configured to output an excitation signal to the measurement circuit and the sensor/heater assembly, measure a resonant frequency of the measurement circuit and the sensor/heater assembly in response to the excitation signal; determine at least one capacitance value based on the resonant frequency; and determine whether a body part is in proximity to the sensor based on the at least one capacitance value.

In other features, the sensor/heater assembly includes a substrate. The sensor is arranged on one surface of the substrate. The heater is arranged on an opposite surface of the substrate.

In other features, the substrate comprises a material selected from a group consisting of foam, felt, woven fabric and knitted fabric. The sensor comprises a first wire arranged in a first predetermined pattern on the one surface of the substrate. The heater comprises a second wire arranged in a second predetermined pattern on the opposite surface of the substrate. The second wire in the second predetermined pattern has a spacing with a maximum distance that is less than or equal to 4 mm, 3 mm, or 2 mm.

In other features, non-conductive thread attaches at least one of the sensor and the heater to the substrate. The measurement circuit includes an LC tank circuit. An excitation circuit is in communication with the LC tank circuit and is configured to generate the excitation signal that is output to the LC tank circuit. A frequency measurement circuit is in communication with the LC tank circuit and is configured to measure the resonant frequency in response to the excitation signal. A controller is configured to trigger the excitation signal; receive the resonant frequency; determine the capacitance value based on the resonant frequency; and determine whether the body part is in proximity to the sensor based on the capacitance value.

In other features, a driver circuit is arranged between the LC tank circuit and the heater and is configured to drive the heater in response to the excitation signal. In other features, a shield layer is arranged adjacent to the heater. The shield layer is connected by a capacitor to the heater and the driver circuit. The sensor and the heater are arranged around a steering wheel. The sensor and the heater are arranged in a vehicle seat assembly.

In other features, the measurement circuit includes a driver circuit including a high side switch configured to selectively connect one end of the heater to a voltage reference and a low side switch configured to selectively connect another end of the heater to a reference potential. A driver switch is configured to selectively connect the driver circuit to the heater.

In other features, the controller configures states of the high side switch, the low side switch and the driver switch in (i) an active mode and (ii) at least one of a passive open mode and a passive closed mode during both calibration and measurement of the capacitance value.

During the active mode, the controller configures the high side switch and the low side switch in open states and the driver switch in a closed state.

During the passive closed mode, the controller configures the high side switch and the driver switch in an open state and the low side switch in a closed state. During the passive open mode, the controller configures the high side switch, the driver switch and the low side switch in open states. The controller is configured to operate in a first calibration mode, a second calibration mode and a measurement mode. The controller is configured to determine a first capacitance value during the first calibration mode based on a capacitance of the capacitance measuring system without the heater and the capacitance sensing layer attached thereto.

In other features, the controller is configured to operate in the second calibration mode one time and to operate in the measurement mode a plurality of times. The controller is configured to perform an active calibration mode, a passive open calibration mode, an active measurement mode and a passive open measurement mode.

In other features, the controller is configured to determine a first capacitance value in the active calibration mode; determine a second capacitance value in the passive open calibration mode; and calculate a sensor to body capacitance value during calibration based on the second capacitance value in the passive open calibration mode.

In other features, the sensor to body capacitance value during calibration ($C_{sensor\_body\_0}$) is equal to $2*(C_{all\_PO\_0}-C_{ECU})$, where $C_{all\_PO\_0}$ is the second capacitance value in the passive open calibration mode and $C_{ECU}$ is a calibrated capacitance. The controller is configured to calculate a shielding parameter based on the first capacitance in the active calibration mode and the second capacitance in the passive open calibration mode. The shielding parameter $P_S$ is equal to $(C_{all\_PO\_0}-C_{ECU})/(C_{all\_PO\_0}+C_{all\_A\_0}-2*C_{ECU})$, where $C_{all\_A\_0}$ is the first capacitance value in the active calibration mode, $C_{all\_PO\_0}$ is the second capacitance value in the passive open calibration mode and $C_{ECU}$ is a calibrated capacitance.

In other features, the controller is configured to determine a first capacitance in the active measurement mode; determine a second capacitance in the passive open measurement mode; and calculate the capacitance of the body part based on the first capacitance in the active measurement mode and the first capacitance in the active calibration mode.

In other features, the capacitance of the body part is equal to $2*(C_{all\_A}-C_{all\_A\_0})$, where $C_{all\_A\_0}$ is the first capacitance value in the active calibration mode and $C_{all\_A}$ is the first capacitance value in the active measurement mode. The controller is configured to calculate a sensor to body capacitance value during measurement based on the second capacitance value in the passive open measurement mode; and calculate a temperature compensation value based on the shielding parameter, the sensor to body capacitance value during measurement, and the sensor to body capacitance value during calibration.

In other features, the controller is configured to compensate the capacitance of the body part based on the temperature compensation value. The sensor to body capacitance value during measurement is equal to $2*(C_{all\_PO}-C_{ECU})$, wherein $C_{all\_PO}$ is the second capacitance value in the passive open measurement mode and $C_{ECU}$ is a calibrated capacitance.

In other features, the temperature compensation value ($\Delta C_{res}$) is equal to:

$$\frac{1-P_S}{2*P_S}*(C_{sensor\_body}-C_{sensor\_body\_0})$$

where $P_S$ is the shielding parameter, $C_{sensor\_shield}$ is the sensor to body capacitance value during measurement, and $C_{sensor\_shield\_0}$ is the sensor to body capacitance value during calibration. The compensated capacitance of the body part is equal to a sum of the capacitance of the body part and a product of the temperature compensation value and a coefficient.

In other features, the controller is configured to periodically perform an active calibration mode, a passive closed calibration mode, an active measurement mode and a passive closed measurement mode. The controller is configured to determine a first capacitance value in the active calibration mode; determine a second capacitance value in the passive closed calibration mode; calculate a shielding parameter based on the first capacitance in the active calibration mode and the second capacitance in the passive closed calibration mode; and calculate a sensor to shield capacitance value during calibration based on the shielding parameter and the second capacitance value in the passive closed calibration mode.

In other features, the shielding parameter ($P_S$) is equal to $(C_{all\_PC\_0}-C_{all\_PC\_0}-C_{ECU})$, where $C_{all\_A\_0}$ is the first capacitance value in the active calibration mode, $C_{all\_PC\_0}$ is the second capacitance value in the passive closed calibration mode and $C_{ECU}$ is a calibrated capacitance. The sensor to shield capacitance value during calibration is equal to $2*P_S*(C_{all\_PC\_0}-C_{ECU})$, where $C_{all\_PC\_0}$ is the second capacitance value in the passive closed calibration mode, $P_S$ is the shielding parameter, and $C_{ECU}$ is a calibrated capacitance.

In other features, the controller is configured to determine a first capacitance in the active measurement mode; determine a second capacitance in the passive closed measurement mode; and calculate the capacitance of the body part based on the first capacitance in the active measurement mode and the second capacitance in the active calibration mode.

In other features, the controller is configured to calculate a sensor to shield capacitance value during measurement based on the second capacitance value in the passive closed measurement mode and the shielding parameter; and calculate a temperature compensation value based on the shielding parameter, the sensor to shield capacitance value during measurement, and the sensor to shield capacitance value during calibration.

In other features, the controller is configured to compensate the capacitance of the body part based on the temperature compensation value.

In other features, the sensor to shield capacitance value during measurement is equal to $2*P_S*(C_{all\_Pc}-C_{ECU})$, wherein $C_{all\_PC}$ is the second capacitance value in the passive closed measurement mode, $P_S$ is the shielding parameter, and $C_{ECU}$ is a calibrated capacitance. The temperature compensation value ($\Delta C_{res}$) is equal to:

$$\frac{1-P_s}{2*P_s}*(C_{sensor\_shield}-C_{sensor\_shield\_0})$$

where $P_S$ is the shielding parameter, $C_{sensor\_shield}$ is the sensor to shield capacitance value during measurement, and $C_{sensor\_shield\_0}$ is the sensor to shield capacitance value during calibration.

In other features, the compensated capacitance of the body part is equal to a sum of the capacitance of the body part and a product of the temperature compensation value and a coefficient. The controller is configured to determine a first capacitance in the active measurement mode; determine a second capacitance in the passive closed measurement mode; and calculate the capacitance of the body part based on the first capacitance in the active measurement mode, the shielding parameter, and the second capacitance in the passive closed measurement mode.

In other features, the capacitance of the body part is calibrated without temperature compensation. The controller is configured to calculate the capacitance of the body part based on $$2*\frac{C_{all\_PC}*(P_s-1)-P_s*C_{ECU}+C_{all\_A}}{P_s}$$

wherein $C_{all\_PC}$ is the second capacitance during the passive closed measurement mode, $P_S$ is the shielding parameter, $C_{all\_A}$ is the first capacitance during the active measurement mode and $C_{ECU}$ is a calibrated capacitance.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a plan view and partial cross-sectional view of an example of a steering wheel including a capacitive sensing and heating system according to the present disclosure;

FIG. 1B is a side view and partial cross-sectional view of an example of a seat including a capacitive sensing and heating system according to the present disclosure;

FIG. 2A is a side cross-sectional view of an example of a first layer of a multi-layer heater and sensor according to the present disclosure;

FIG. 2B is a side cross-sectional view of an example of a second layer of the multi-layer heater and sensor according to the present disclosure;

FIG. 2C is a side cross-sectional view of an example of the multi-layer heater and sensor according to the present disclosure;

FIG. 2D is a plan view illustrating an example of a shield layer according to the present disclosure;

FIG. 2E is a plan view illustrating an example of a heater layer according to the present disclosure;

FIG. 3 is a side cross-sectional view of another example of the multi-layer heater and sensor without a shield layer according to the present disclosure;

In the drawings, reference numbers may be reused to identify similar and/or identical elements.

DETAILED DESCRIPTION

Figure 4A:
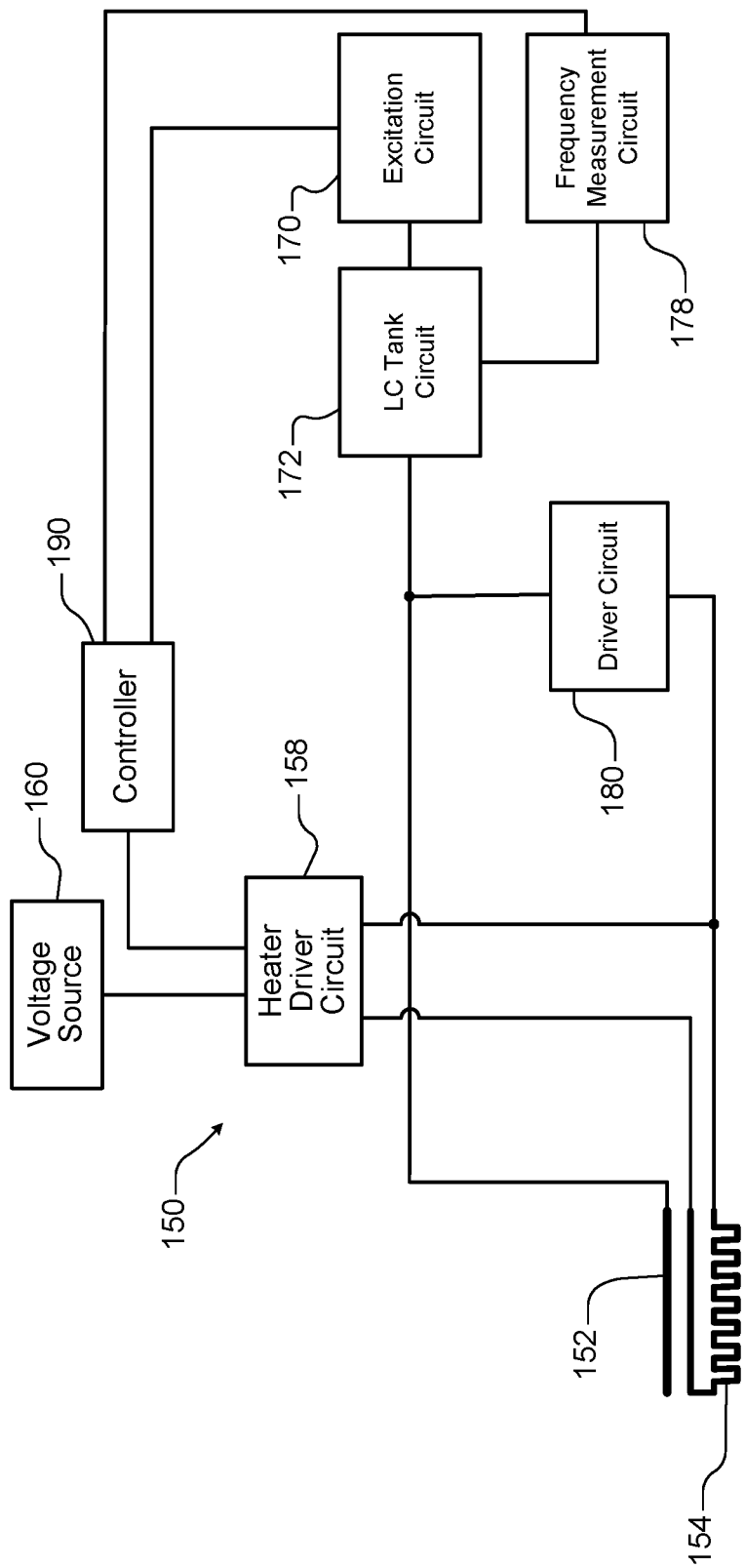
FIG. 4A is a simplified electrical schematic of an example of a capacitive sensing and heating system according to the present disclosure.

The foregoing disclosure relates to measuring capacitance to determine the presence or absence of a hand or other body part of an occupant of a vehicle on a steering wheel of a vehicle or an occupant in a seat, it can be appreciated that the disclosure relates more generally to the detection of the presence or absence of contact in other locations of vehicles and/or in other non-vehicle environments.

Referring now to FIG. 1A, a capacitive sensing and heating system 20 for a steering wheel 22 is shown. The capacitive sensing and heating system 20 includes a capacitive sensing and heating controller 24. In some examples, a switch 28 may be used by a passenger to actuate heating of the steering wheel 22. After sensing the capacitance (or resonant frequency), the capacitance sensing and heating controller may report the results to one or more other vehicle controllers via a vehicle communication bus.

The steering wheel 22 includes a multi-layer heater and sensor 42 that is located adjacent to or wrapped around a steering wheel support portion 40. The multi-layer heater and sensor 42 may define a single heating zone or a plurality of heating zones. Capacitance sensing may also be performed in a single sensing zone or a plurality of sensing zones. The capacitive sensing and heating controller 24 controls timing and the supply of power during heating. The capacitive sensing and heating controller 24 also controls timing and measurement of capacitance during sensing.

Referring now to FIG. 1B, a capacitive sensing and heating system 50 for a seat 51 is shown. The seat 51 includes a seat portion 52 and a backrest portion 54. The capacitive sensing and heating system 50 includes a capacitive sensing and heating controller 58. In some examples, a switch 62 may be used by a passenger to actuate heating of the seat 51.

In some examples, the switch 28 (FIG. 1A) and the switch 62 (FIG. 1B) include a physical switch or button. In other examples, the switches 28 and 62 may be accessed via a touchscreen associated with an infotainment system or other input device. In still other examples, the switches 28 and 62 are actuated automatically in conjunction with a heating, ventilation and air conditioning system (HVAC) (not shown).

The seat 51 includes a multi-layer heater and sensor 64 that is located in the seat portion 52. The multi-layer heater and sensor 64 may include a single zone or a plurality of heating and/or sensing zones. The capacitive sensing and heating controller 58 controls timing and the supply of power during heating. The capacitive sensing and heating controller 58 also controls measurement of capacitance that is during sensing.

Referring now to FIGS. 2A-3, various examples of the multi-layer heater and sensor 42 are shown. In FIG. 2A, a first layer 42-1 of the multi-layer heater and sensor 42 is shown. The first layer 42-1 includes a substrate 70 having an upper surface 72 and a lower surface 74. A sensor 80 is arranged on the upper surface 72 of the substrate 70. In some examples, the sensor 80 includes a conductive surface or a wire arranged in a predetermined pattern on the upper surface 72 of the substrate 70.

A heater 86 or heater and heater shield is arranged on the lower surface 74 of the substrate 70. The heater 86 includes a conductive surface, a braided wire, a heater wire or a conductive thread that is arranged in a predetermined pattern on the lower surface 74 of the substrate 70. A nonconductive thread 88 physically connects the sensor 80 and the heater 86 to the substrate 70. For example, the nonconductive thread 88 passes through the substrate 70 and is wound around portions of the sensor 80 and the heater 86 at a plurality of spaced locations to affix the sensor 80 and the heater 86 to the substrate 70. In some examples, the substrate 70 includes foam, although other materials such as woven or knitted fabric may be used. In some examples, the substrate 94 includes foam, felt, woven fabric or knitted fabric, although other materials may be used.

In FIG. 2B, a second layer 42-2 of the multi-layer heater and sensor 42 is shown. When used, the second layer 42-2 includes a substrate 94 and a shield layer 96. In FIG. 2C, the first layer 42-1 and the second layer 42-2 of the multi-layer heater and sensor 42 are arranged adjacent to one another and in contact. One or more additional layers 110 and 114 may be arranged adjacent to upper and lower surfaces of the multi-layer heater and sensor 42, respectively. For example, an outer layer 116 such as leather, fabric, vinyl or other material may be arranged adjacent to the one or more additional layers 110. For steering wheel applications, a steering wheel support portion 118 may be arranged adjacent to the one or more additional layers 114.

In FIG. 2D, an example of the shield layer 96 is shown to include woven or interlaced conductive threads 120 that are connected between electrodes 124 on a substrate 126. In some examples, the conductive threads 120 include carbon threads and the electrodes 124 include silver-coated copper wire strands, although other materials can be used. Suitable examples of a shield layer are shown and described in U.S. Pat. No. 7,838,804, which issued on Nov. 23, 2010 and is hereby incorporated by reference in its entirety.

In FIG. 2E, an example of the heater 86 is shown to include wire 128 arranged in a predetermined pattern on a substrate 130 with predetermined spacing between adjacent wires.

In FIG. 3, the shield layer 96 and/or the substrate 94 can be omitted in some examples. When the heater 86 includes wire arranged in a serpentine pattern to fill a heating area, the density or distance to adjacent wires affects the ability of the heater 86 to provide shielding during capacitance measurement. When the wires are arranged within a predetermined distance of adjacent wires, the heater can be used as a shield layer during capacitance measurement and the shield layer 96 and/or substrate 94 can be omitted. In some examples, when the predetermined distance is less than or equal to 4 mm, the shield layer 96 can be omitted. In other examples, when the predetermined distance is less than or equal to 3 mm, the shield layer 96 can be omitted. In still other examples, when the predetermined distance is less than or equal to 2 mm, the shield layer 96 can be omitted.

Figure 4B:
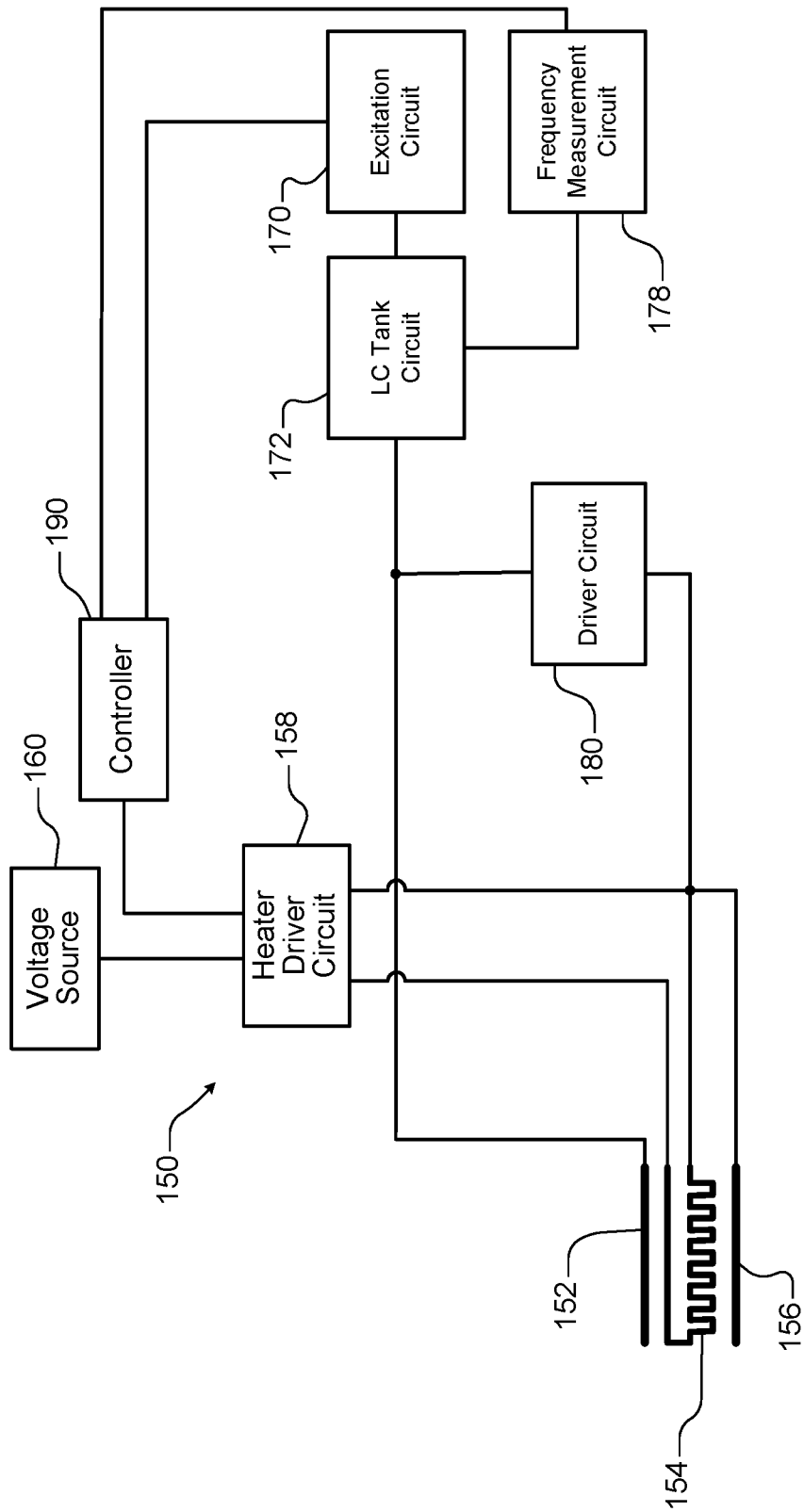
FIG. 4B is a simplified electrical schematic of another example of a capacitive sensing and heating system according to the present disclosure.

Referring now to FIGS. 4A and 4B, simplified electrical schematics of examples of capacitive sensing and heating systems according to the present disclosure are shown. In FIG. 4A, a capacitive sensing and heating system 150 includes a sensor 152 and a heater 154 as described above. A heater driver 158 selectively supplies power from a voltage source 160 to the heater 154 to increase a temperature of the steering wheel. When capacitive sensing is desired, the heater driver 158 does not supply power to the heater 154.

An excitation circuit 170 selectively outputs an excitation signal (such as a square wave or other waveform shape) to a LC tank circuit 172 that is also connected to the sensor 152. The excitation signal is also output to the heater 154 via a driver circuit 180. When a passenger's hands are in the vicinity of the sensor 152, the capacitance of the combined circuit varies. The variation in capacitance, in turn, affects a resonant frequency of the LC tank circuit 172. The driver circuit 180 supplies a similar excitation signal to the heater 154 to eliminate the effect of stray capacitance between the sensor 152 and the heater 154 or other grounded structures nearby (since they are at the same voltage potential).

A frequency measurement circuit 178 measures the resonant frequency of the LC tank circuit 172. A controller 190 controls the timing and operation of heating and capacitance sensing performed by the heater driver 158, the excitation circuit 170 and the frequency measurement circuit 178.

In FIG. 4B, a shield layer 156 such as a conductive surface or wire arranged in a predetermined pattern is optionally arranged beneath the heater 154 (if needed for shielding) to further eliminate the effects of stray capacitance between the sensor 152 and the heater 154 or other grounded structures nearby.

Figure 5A:
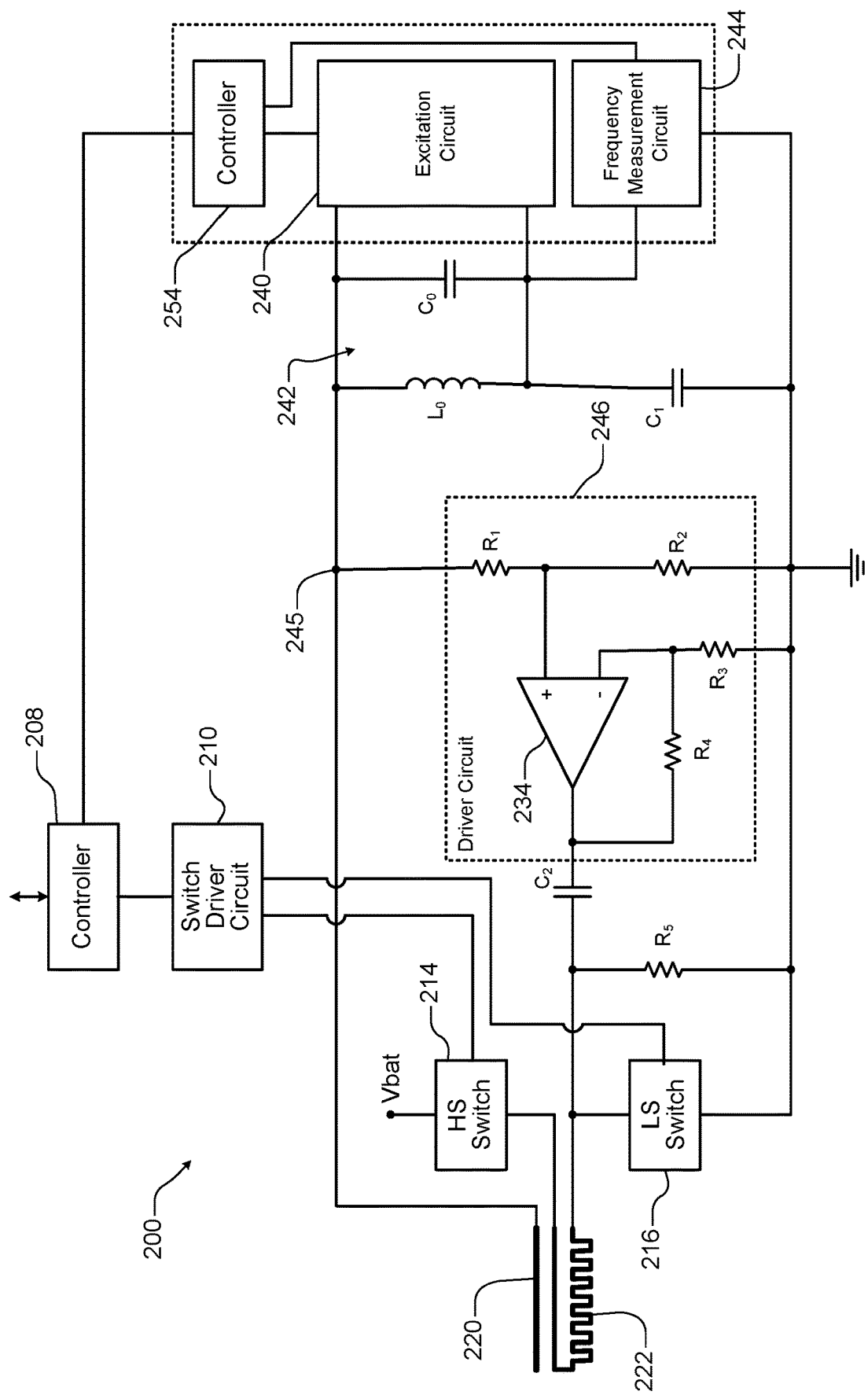
FIG. 5A is a more detailed electrical schematic of an example of a capacitive sensing and heating system according to the present disclosure.
Figure 5B:
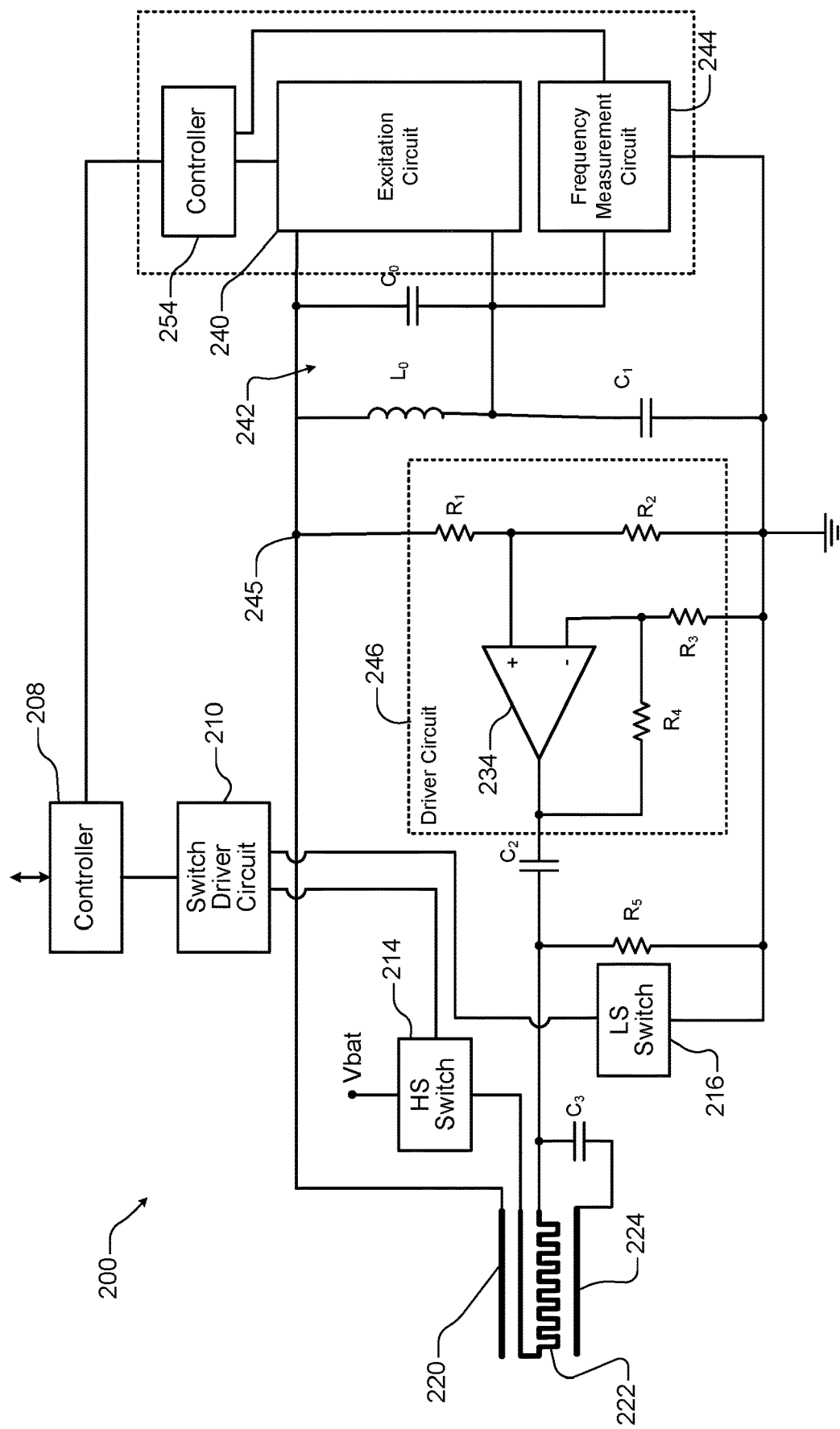
FIG. 5B is a more detailed electrical schematic of another example of a capacitive sensing and heating system according to the present disclosure.

Referring now to FIGS. 5A and 5B, more detailed electrical schematics for examples of capacitive sensing and heating systems according to the present disclosure are shown. In FIG. 5A, a capacitive sensing and heating system 200 includes a sensor 220 and a heater 222. A heater controller 208 enables and controls the switch driver 210, which selectively supplies control signals to a high side (HS) switch 214 and a low side (LS) switch 216. The HS switch 214 includes a first terminal that is connected to a vehicle battery or other power source. The HS switch 214 further includes a second terminal that is connected to one end of the heater 222.

The LS switch 216 includes a first terminal that is connected to an opposite end of the heater 222. The LS switch 216 further includes a second terminal that is connected to the reference potential. Control terminals of the HS switch 214 and the LS switch 216 are connected to the switch driver 210. In some examples, the switch driver 210 supplies a pulse width modulated (PWM) signal to the HS switch 214 and the LS switch 216 based upon demand for heating, although other types of modulation can be used.

An excitation circuit 240 outputs an excitation signal to a LC tank circuit 242 including an inductor $L_0$ and a capacitor $C_0$ that are connected in parallel to the excitation circuit 240. First terminals of the inductor $L_0$ and the capacitor $C_0$ are connected to a first node 245 that is also connected to the sensor 220. In some examples, a capacitance $C_1$ is connected between second terminals of the inductor $L_0$ and capacitor $C_0$ and a reference potential such as ground. The capacitance $C_1$ ensures equal load capacitance for both nodes of the LC tank circuit 242. In some cases this $C_1$ capacitor is not needed and can be omitted A driver circuit 246 includes first and second resistors $R_1$ and $R_2$, respectively that are connected in series between the first node 245 and the reference potential. A non-inverting input of an amplifier 234 is connected between the first resistor $R_1$ and the second resistor $R_2$. An inverting input of the amplifier 234 is connected by a third resistor $R_3$ to the reference potential. A fourth resistor $R_4$ is connected from an output of the amplifier 234 to the inverting input of the amplifier 234.

The output of the amplifier 234 is coupled by a second capacitor $C_2$ to the opposite end of the heater 222 and to a fifth resistor $R_5$ that is also connected to the reference potential. The capacitance $C_2$ connects the driving signal to the heater 222. The resistance $R_5$ ensures the ground DC potential during capacitance sensing.

During heating of the steering wheel, capacitive sensing is inactive. During capacitive sensing, the HS and LS switches disconnect the heater 222 from power. During capacitive sensing, the capacitance of sensor 220 as well as the capacitance $C_0$ and $C_1$ and the inductance $L_0$ forms a parallel LC resonant circuit. The excitation circuit 240 generates the excitation signal causing the parallel LC resonant circuit to oscillate at a resonant frequency determined in part by the capacitance of the sensor 220, $C_0$, $C_1$ and $L_0$. The resonant frequency is measured by the frequency measurement circuit 244.

For example, the resonant frequency may be 253 KHz when the passenger's hands are not on the wheel. The calculated capacitance is 40 pF. This value may be used as a reference. When the passenger's hand or hands are on the wheel, the resonant frequency is 250 kHz and the calculated capacitance is 45.6 pF, The 5.6 pF delta corresponds to the hands on the wheel. In some examples, the delta value is compared to a delta threshold value. For example, a delta threshold of 4.5 pF may be used.

To lower the sensor capacitance between the sensor 220 and the heater 222, the measurement signal is also applied to the heater 222 using the driver circuit 246. The controller 254 controls the switch driver 210, the excitation circuit 240 and the frequency measurement circuit 244. In some examples, the controller, the excitation circuit and the frequency measurement circuit are implemented using an FDC2214-Q1, an FDC2114-Q1, an FDC2212-Q1 or an FDC2112-Q1 chip available from Texas Instruments, Inc.

In FIG. 5B, a shield layer 224 is arranged adjacent to the heater 222 to provide additional shielding if needed. The driver circuit 246 is further connected to the shield layer 224 by a third capacitance $C_3$. The driver circuit 246 outputs a signal onto the heater 222 and the shield layer 224 during excitation and/or frequency measurement to neutralize stray capacitance.

Figure 6:
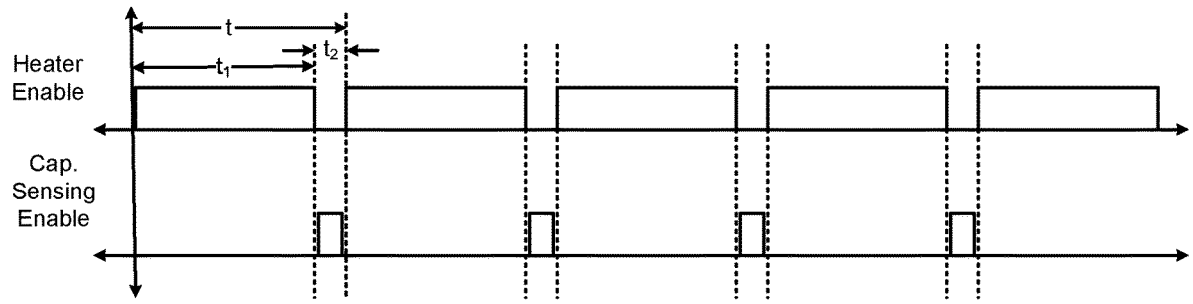
FIG. 6 is a timing diagram illustrating an example of time multiplexing of heating and capacitive sensing.

Referring now to FIG. 6, the controller 254 performs time multiplexing of heater enable and capacitive sensing enable signals. The controller performs heating and capacitive sensing during a period t. The period t includes a first sub-period $t_1$ during which heating is performed and a second sub-period $t_2$ during which capacitive sensing is performed. In some examples, the first sub-period $t_1$>the second sub-period $t_2$. In some examples, the first sub-period $t_1 \geq 85\%$ t and the second sub-period $t_2 \leq 15\%$ t, although other values can be used.

Figure 7:
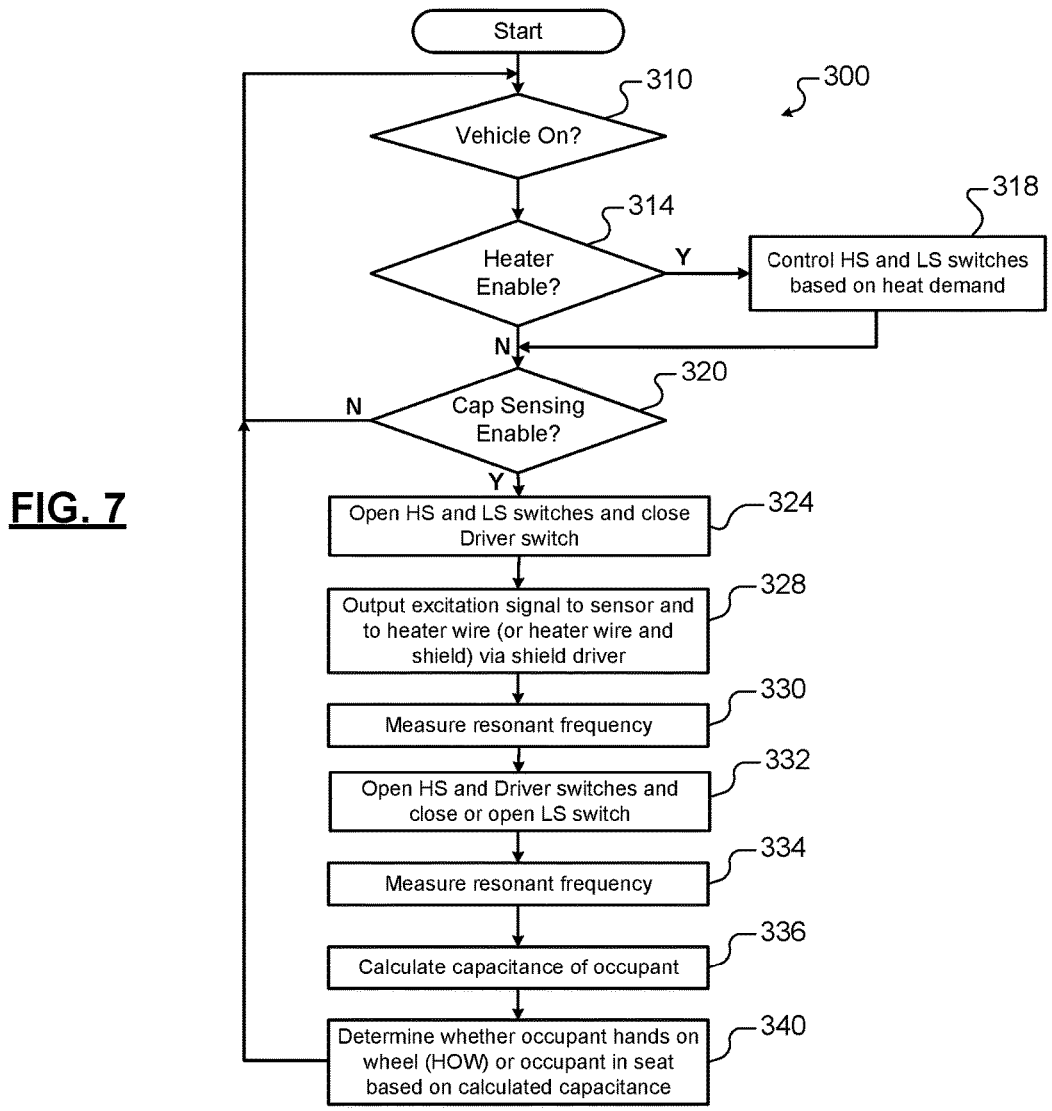
FIG. 7 is a flowchart illustrating an example of a method for operating a capacitive sensing and heating system according to the present disclosure.

Referring now to FIG. 7, a method 300 for operating a capacitive sensing and heating system according to the present disclosure is shown. At 310, the method determines whether the vehicle is ON. In some examples, the vehicle is ON when an ignition switch or other switch is ON, however other criteria may be used. At 314, the method determines whether heating is enabled. If 314 is true, HS and LS switches are controlled based on heat demand at 318 and the method continues at 320.

At 320, the method determines whether capacitive sensing is enabled. If 320 is false, the method returns to 310. If 320 is true, the method continues at 324 and opens the HS and LS switches (and close the driver switch shown in FIG. 8). At 328, an excitation signal is output to the LC tank circuit and to the heater (or the heater and the shield layer if used). At 330, the resonant frequency is measured. At 332, the HS and the driver switch are opened (and LS switches is closed or opened). At 334, the resonant frequency is determined.

At 336, the total capacitance of the circuit is determined. At 340, either the controller or another vehicle controller determines whether the hands of the passengers are on the wheel (or the passenger is located in the seat) based on the calculated capacitance or delta capacitance values. In some examples, the resonant frequency or delta frequency can be used to identify whether or not the passengers hands are on the steering wheel. For example, the resonant frequency can be compared to one or more frequency thresholds or used to index a lookup table.

Figure 8:
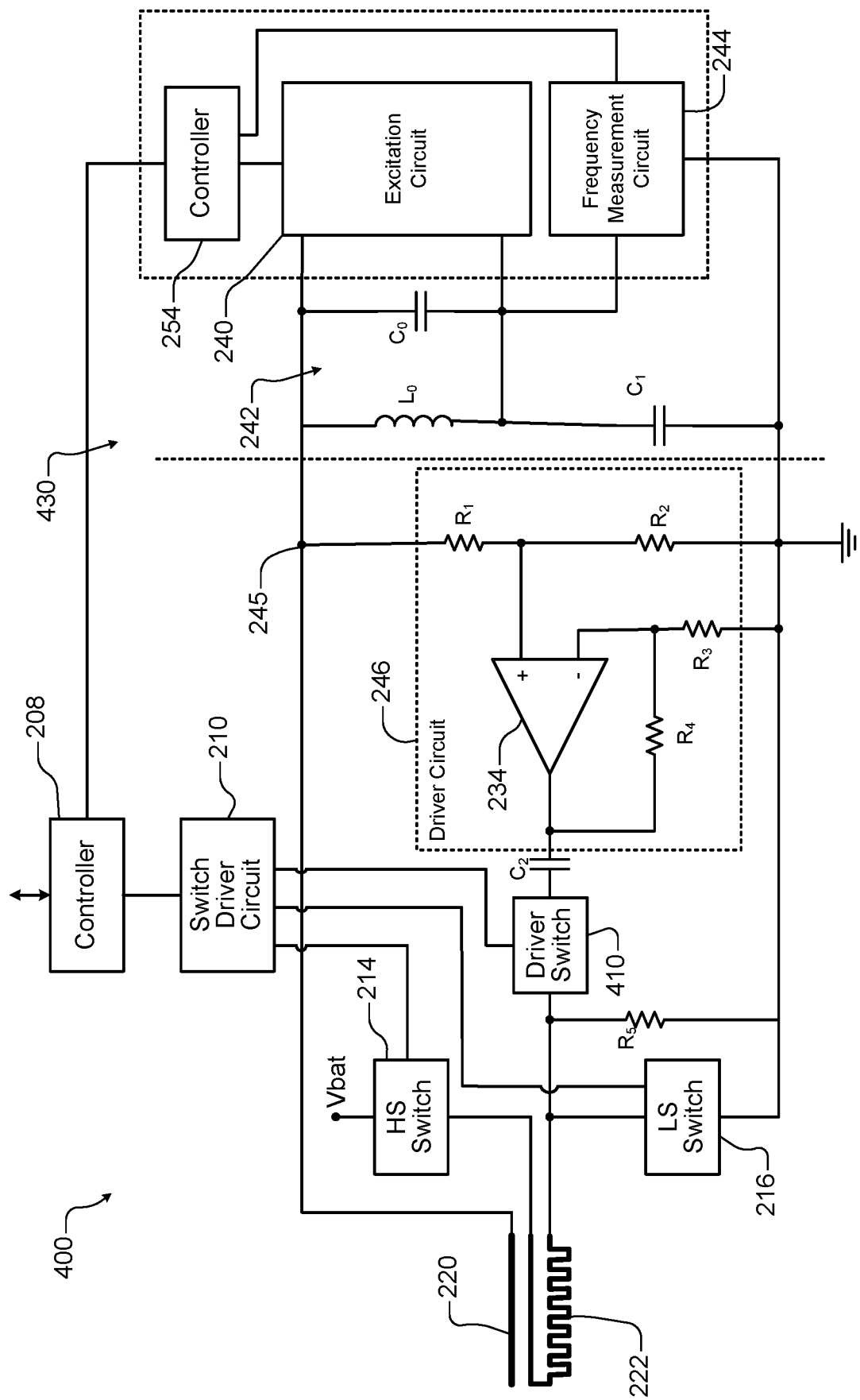
FIG. 8 is a more detailed electrical schematic of another example of a capacitive sensing and heating system according to the present disclosure.

Referring now to FIG. 8, a capacitive sensing and heating system 400 that is similar to FIG. 5A is shown. In some examples, the sensor 220 and the heater 222 are used without a shield. In other examples, a separate shield such as the shield 224 in FIG. 5B is used. A driver switch 410 includes a first terminal connected to the capacitor $C_2$ and a second terminal connected to the resistor $R_5$, the LS switch 216 and the heater 222, which may also act as the shield. States of the HS switch 214, the LS switch 216 and the driver switch 410 are controlled to provide various operating modes including a heating mode, calibration modes, an active mode, a passive open mode and/or a passive closed mode as will be described further below.

Figure 9A:
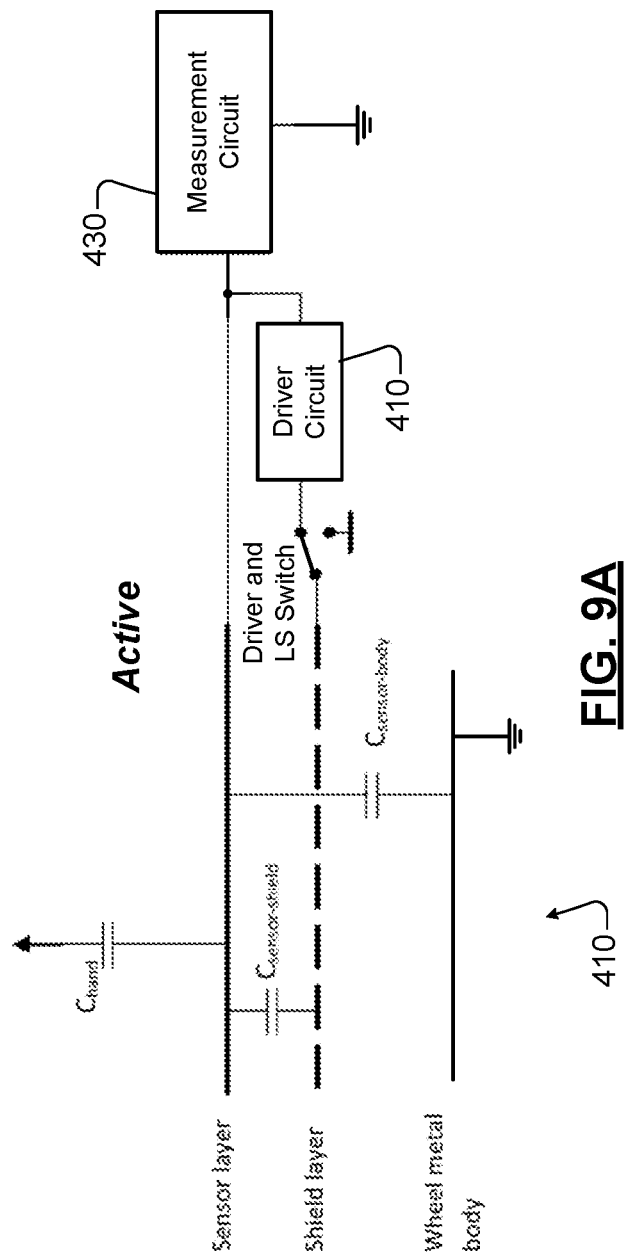
FIG. 9A is a simplified electrical schematic of a portion of the capacitive sensing and heating system in an active mode according to the present disclosure.
Figure 9B:
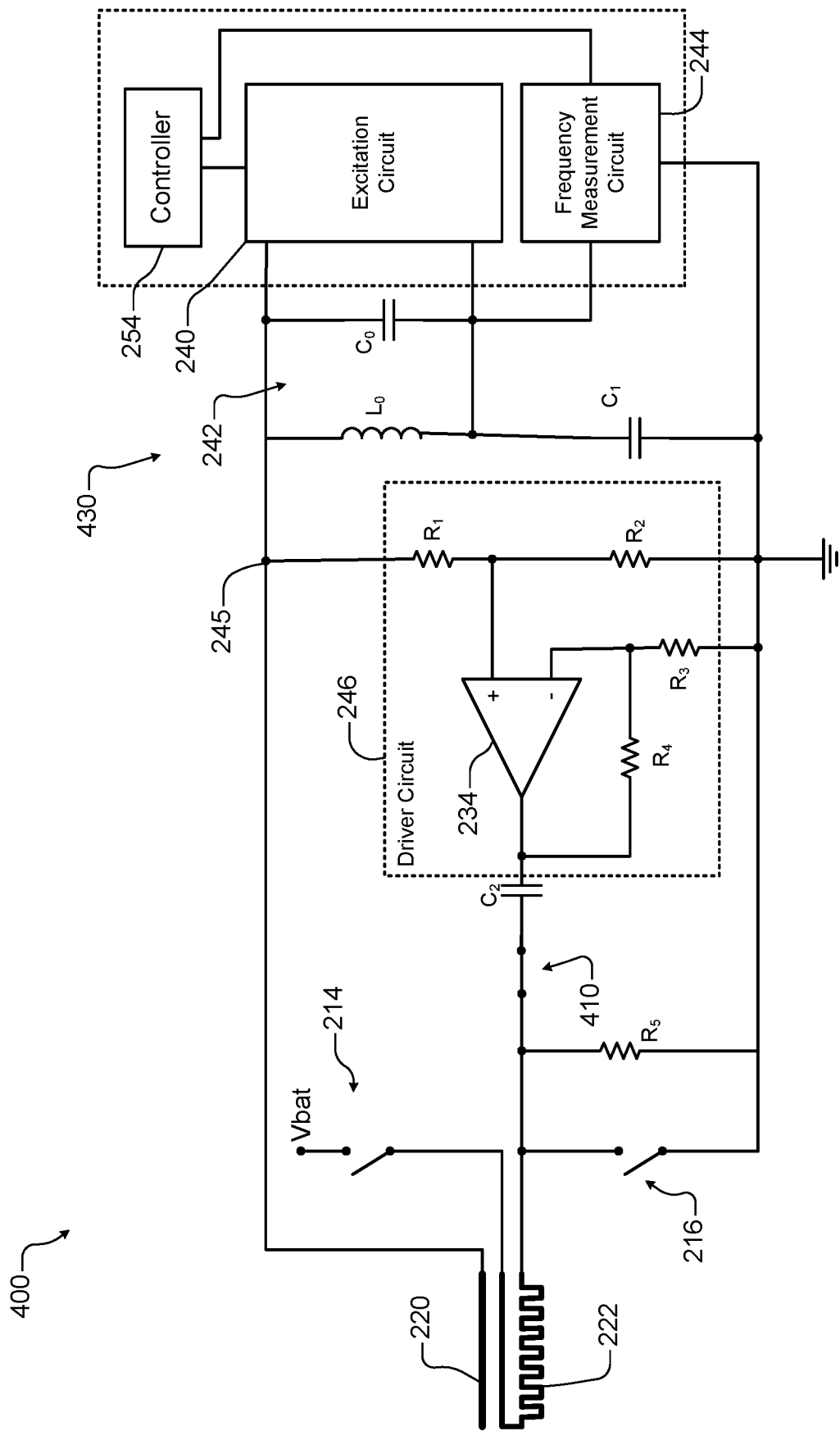
FIG. 9B is a more detailed electrical schematic of the capacitive sensing and heating system in the active mode according to the present disclosure.

In FIGS. 9A and 9B, an active measurement mode or active mode is shown. In FIG. 9A, the circuit is shown to include capacitances $C_{hand}$, $C_{sensor-shield}$ and $C_{sensor\_body}$. In some examples, a measurement circuit 430 includes the LC tank circuit 242, the excitation circuit 240, the frequency measurement circuit 244 and the controllers 208 and 254. The capacitance $C_{hand}$ represents capacitance between the sensor 220 and nearby body parts such as a hand, posterior or other body part of an occupant. The capacitance $C_{sensor-shield}$ represents the capacitance between the sensor 220 and the heater 222. The capacitance $C_{sensor\_body}$ represents the capacitance between the sensor and the vehicle body or other reference potential. In FIGS. 9A and 9B, while in the active mode, the HS switch 214 and the LS switch 216 are opened and the driver switch 410 is closed. The excitation circuit 240 generates the excitation signal and the resonant frequency is measured.

In the active mode, the measurement result is called $C_{all\_A}$. The capacitance of the $C_{sensor-shield}$ is significantly reduced. The shield layer hides the sensor-body capacitor ($C_{sensor-body}$). The active mode is used to measure changes in capacitance $C_{hand}$ due to a hand touching the steering wheel or capacitances related to other body parts. The capacitance $C_{hand}$ is high relative to $C_{sensor-body}$ and $C_{sensor-shield}$. Therefore, $C_{hand}$ can be detected. $C_{all\_A}$ is used to calculate $C_{hand}$, as will be described further below.

Figure 10A:
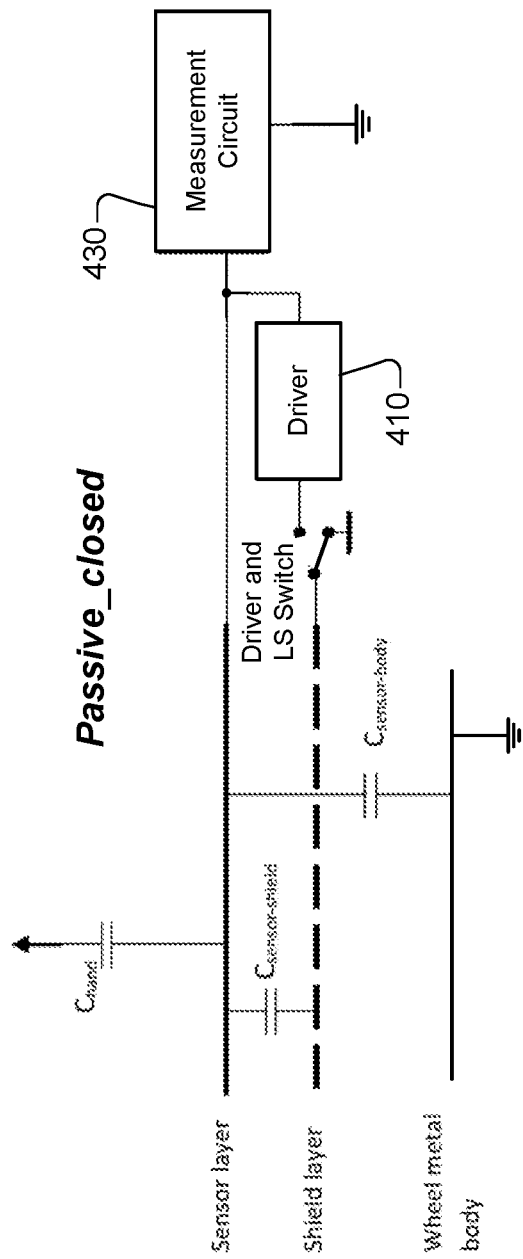
FIG. 10A is a simplified electrical schematic of a portion of the capacitive sensing and heating system in a passive closed mode according to the present disclosure.
Figure 10B:
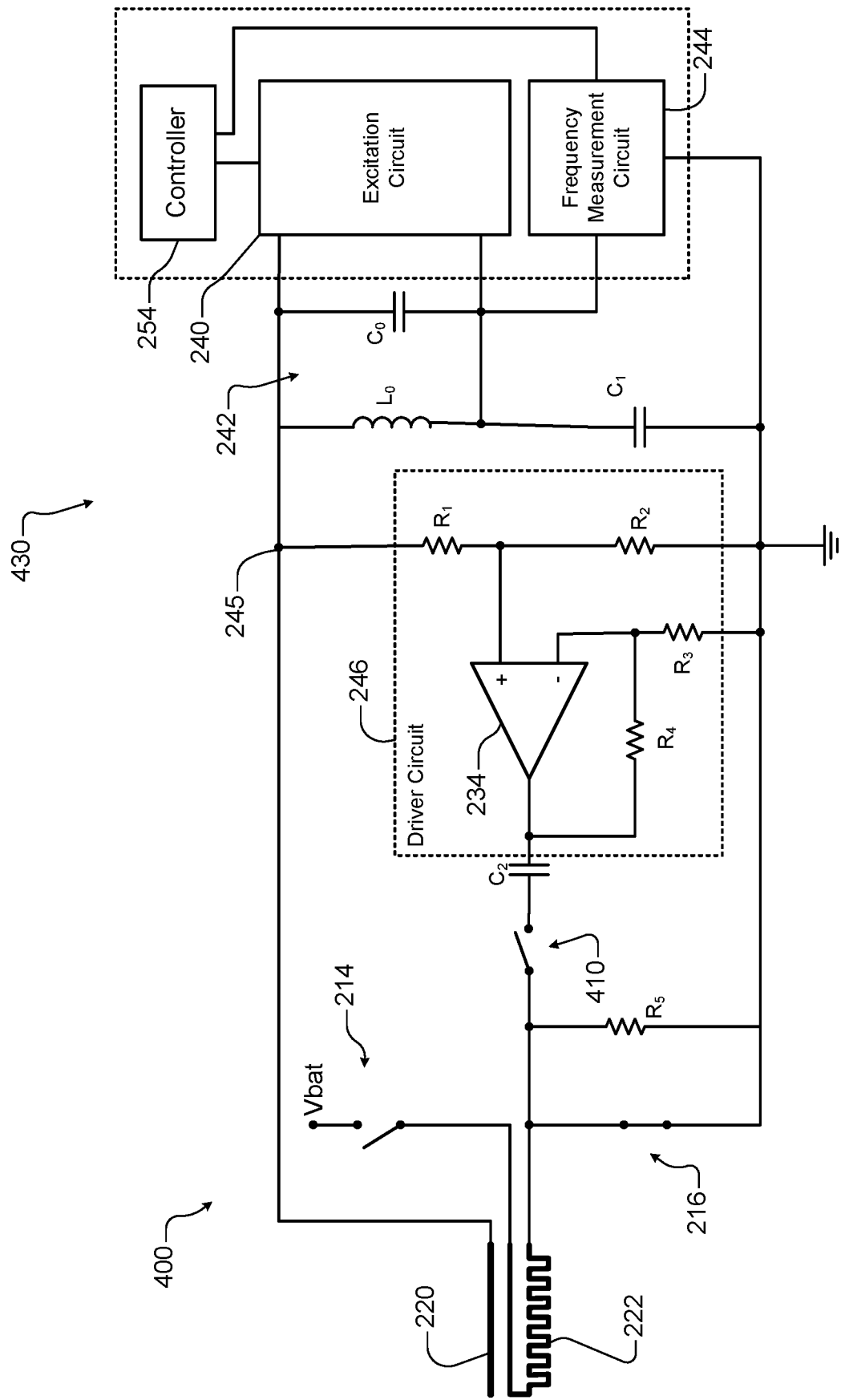
FIG. 10B is a more detailed electrical schematic of the capacitive sensing and heating system in the passive closed mode according to the present disclosure.

In FIGS. 10A and 10B, a passive closed measurement mode or passive closed mode is shown. In the passive closed mode, the HS switch 214 and the driver switch 410 are opened and the LS switch 216 is closed. The excitation circuit 240 generates the excitation signal and the resonant frequency is measured.

In the passive closed mode, the measurement result is called $C_{all\_PC}$. The capacitance $C_{all\_PC}$ includes $C_{sensor-shield}$ and some capacitance due to $C_{sensor-body}$ (which is also partially hidden by the shield layer in this setup as well). In addition, includes some capacitance due to $C_{hand}$ as well. However, $C_{hand}$ does not influence the measurement much due to its lower capacitance value. $C_{all\_PC}$ is used to calculate $C_{sensor-shield}$ and $C_{sensor-body}$ summarized values as will be described further below.

Figure 11A:
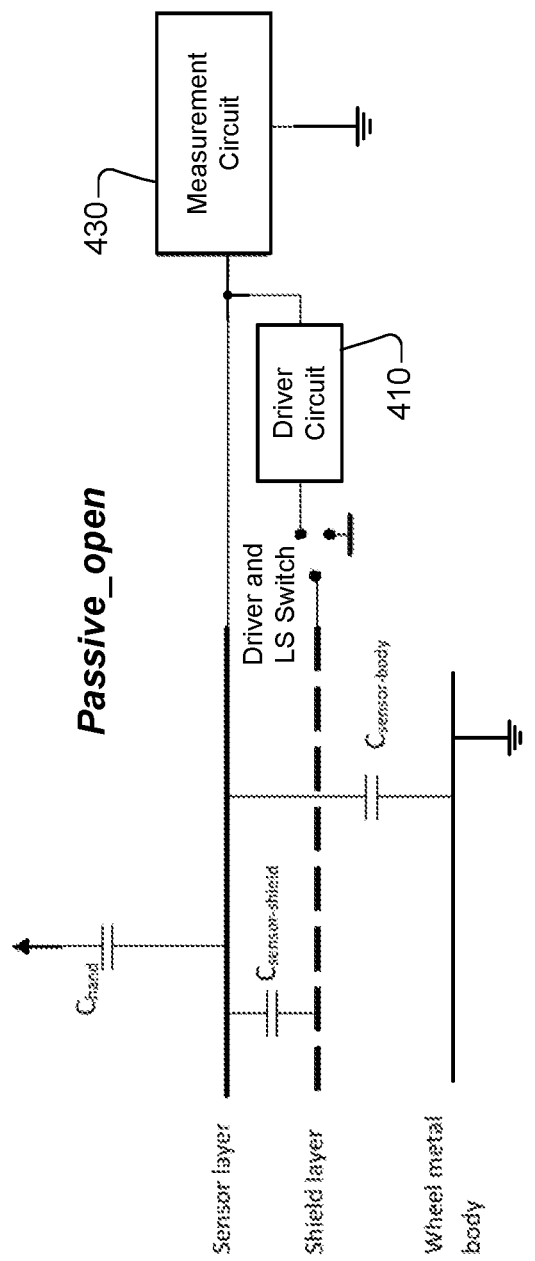
FIG. 11A is a simplified electrical schematic of a portion of the capacitive sensing and heating system in a passive open mode according to the present disclosure.
Figure 11B:
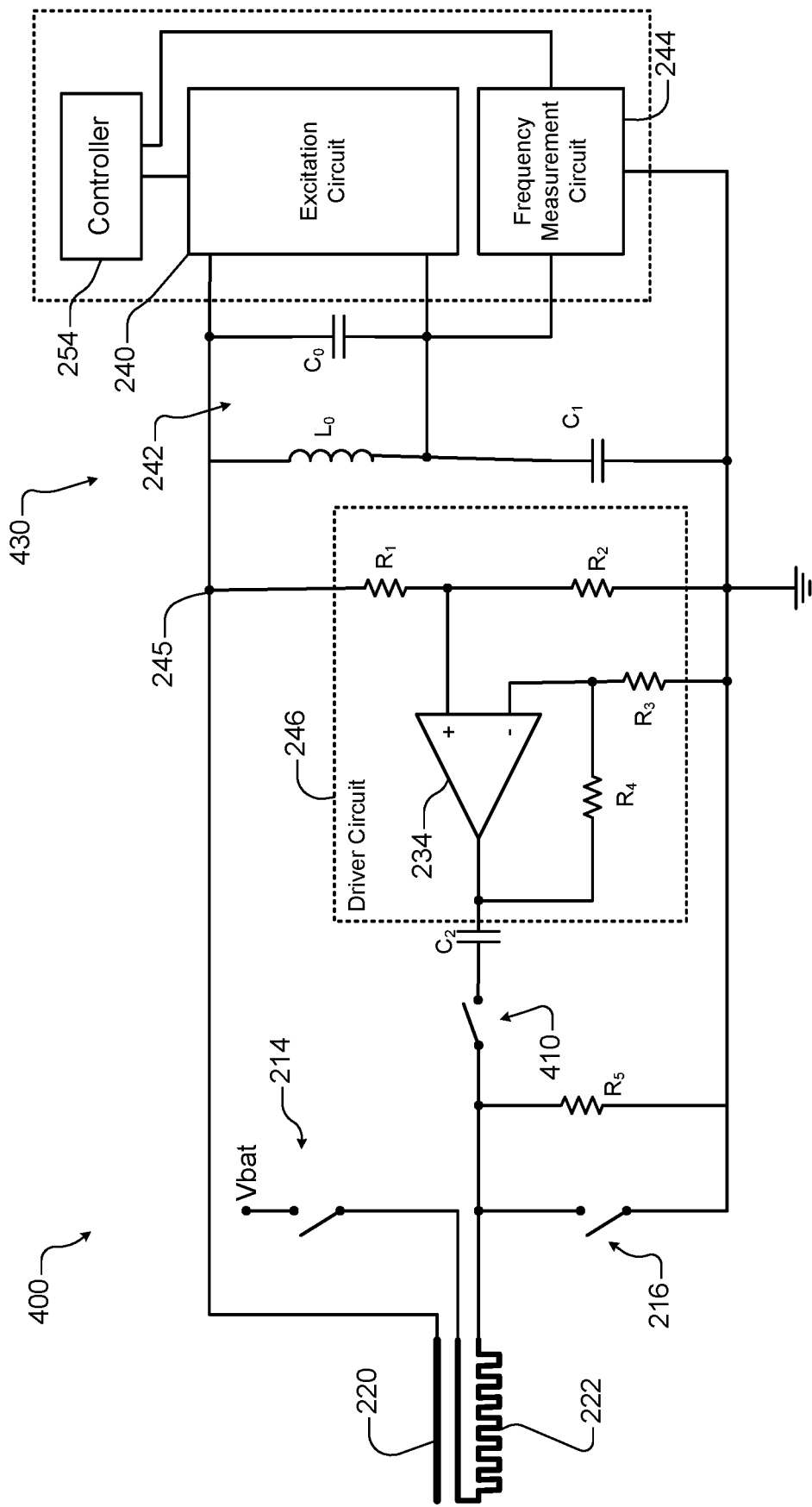
FIG. 11B is a more detailed electrical schematic of the capacitive sensing and heating system in the passive open mode according to the present disclosure.

In FIGS. 11A and 11B, a passive open mode is shown. While in the passive open mode, the HS switch 214, the driver switch 410 and the LS switch 216 are opened. The excitation circuit 240 generates the excitation signal and the resonant frequency is measured.

While in the passive open mode, the measurement result is called $C_{all\_PO}$. $C_{all\_PO}$ includes the sensor-body capacitor ($C_{sensor-body}$) value. In addition, $C_{all\_PO}$ includes some capacitance due to $C_{hand}$ as well. However, $C_{hand}$ does not influence the measurement much due to its lower capacitance value. In some examples, $C_{all\_PO}$ is used to calculate the $C_{sensor-body}$ values.

In some examples, calibration and measurement are performed using the active mode and either the passive open mode or passive closed mode. In some examples, calibration and measurement are performed using the active mode and both the passive open mode and passive closed mode.

Figure 12:
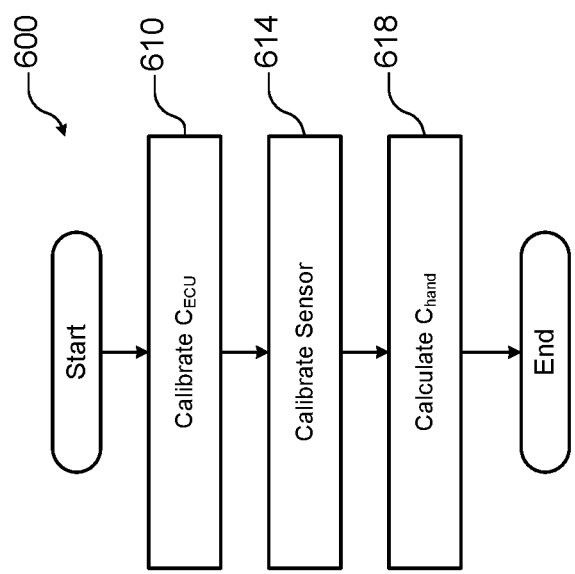
FIG. 12 is a flowchart of an example of a method for calibrating the capacitive sensing and heating system according to the present disclosure.

Referring now to FIG. 12, a method 600 for calibrating the capacitive sensing and heating system is shown. At 610, the method calibrates the capacitance $C_{ECU}$. In some examples, calibration of $C_{ECU}$ is performed once. At 614, the sensor is calibrated by measuring a set including one or more capacitance values (eg. $C_{all\_A}$, $C_{all\_PC}$, and/or $C_{all\_PO}$) using the active mode, the passive open mode, and/or the passive closed mode with no body parts or other objects arranged proximate to the sensor layer. Once the capacitance values are calibrated, similar measurements are used during detection to determine the same values and/or other capacitance values such as $C_{hand}$ at 618. The values $C_{ECU}$, $C_{all\_A}$, $C_{all\_PC}$, and/or $C_{all\_PO}$ are used to calculate $C_{hand}$.

Figure 13:
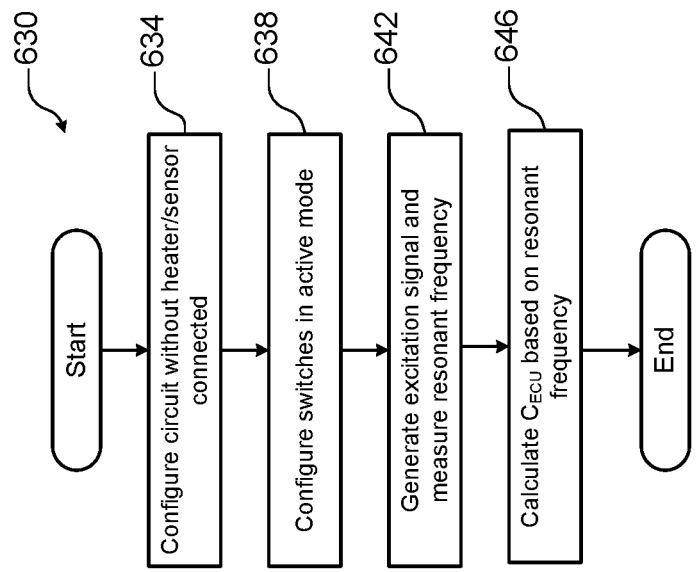
FIG. 13 is a flowchart of an example of a method for determining an ECU capacitance value $C_{ECU}$ according to the present disclosure.

Referring now to FIG. 13, a method 630 for determining $C_{ECU}$ is shown. At 634, the circuit is configured without a harness including the sensor 220 and the heater 222 (and/or shield) connected. At 638, the HS switch (open), the LS switch (open) and the driver switch (closed) are configured in an active mode. At 642, the excitation signal is generated and the resonant frequency is measured. At 646, the ECU capacitance $C_{ECU}$ is determined. The $C_{ECU}$ value includes $C_0$ and $C_1$ of the LC tank circuit 242 and stray capacitance of a printed circuit board. In some examples, the measurement of $C_{ECU}$ and may be performed once prior to connecting the ECU to the system. In other examples, the value of $C_{ECU}$ may be treated as a calibration constant for a given system configuration (e.g. calibrated once for a configuration—either in each vehicle or in a representative vehicle) and stored in memory of the controller without performing in-vehicle calibration of $C_{ECU}$.

Figures 14, 15:
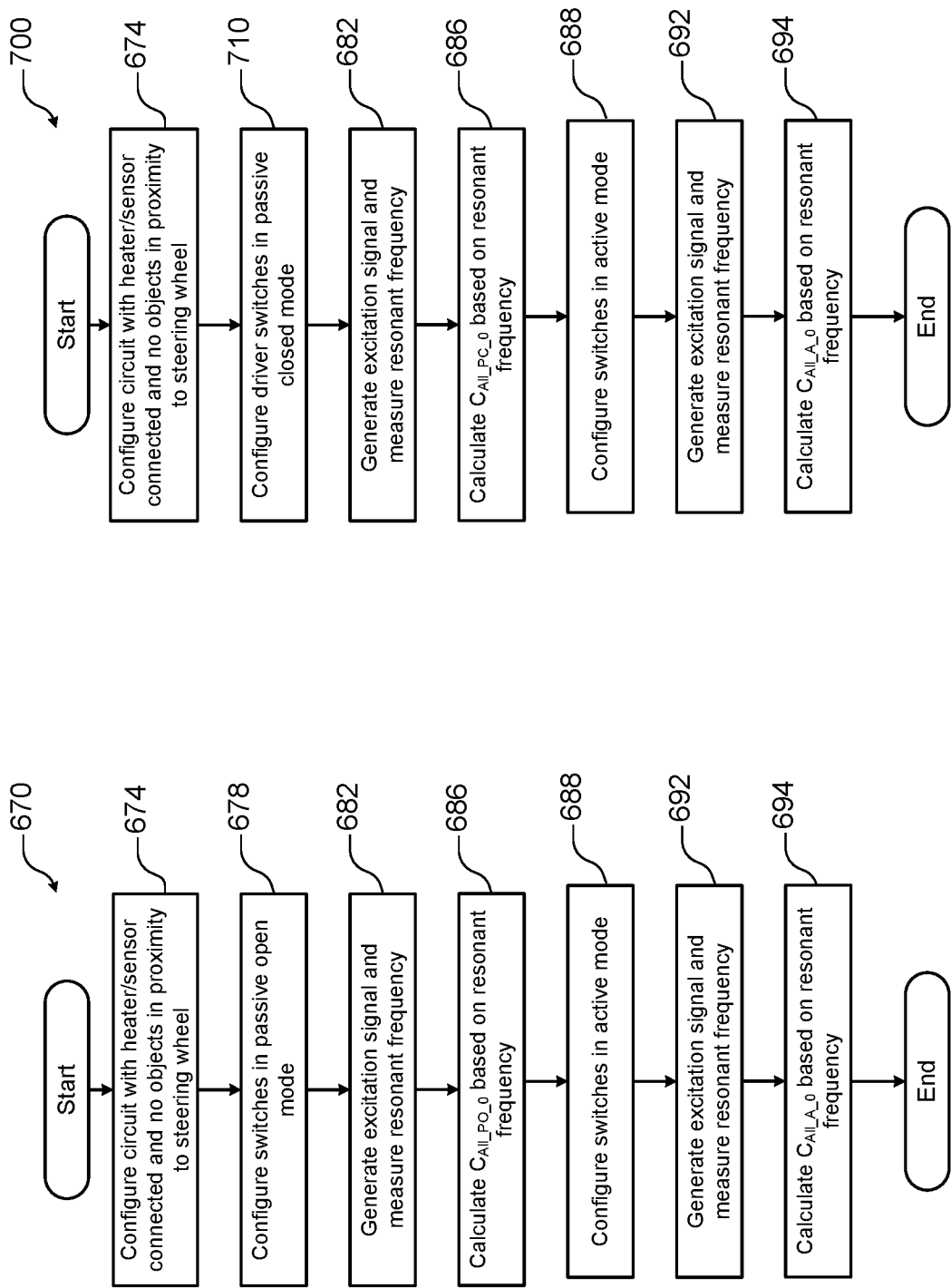
FIG. 14 is a flowchart of an example of a method for determining capacitance values during a passive open mode and an active mode according to the present disclosure.
FIG. 15 is a flowchart of an example of a method for determining capacitance values during a passive closed mode and an active mode according to the present disclosure.

Referring now to FIGS. 14 and 15, methods for calculating capacitance values for sensor calibration are shown. In FIG. 14, a method 670 for determining capacitance values during a passive open mode and an active mode is shown. At 674, the circuit is configured with the heater/sensor connected. At 678, the switches are configured in the passive open mode. At 682, the excitation signal is generated and the resonant frequency is measured. At 686, the capacitance $C_{all\_PO\_0}$ is measured. At 688, the switches are configured in an active mode. At 692, the excitation signal is generated and the resonant frequency is measured. At 694, the capacitance $C_{all\_A\_0}$ is measured.

In FIG. 15, a method 700 for determining capacitance values for sensor calibration during a passive closed mode and an active mode is shown. The method is similar to that shown above in FIG. 14 except that the switches are configured in a passive closed mode at 710 and $C_{all\_PC\_0}$ is measured.

During the calibration measurements in FIGS. 14 and/or 15, the sensor is connected to the controller unit, the steering wheel surface is not touched, and no body parts or objects are located near the steering wheel. The measurement includes active measurement and passive (open or closed) measurement. If the passive open measurement is used during calibration, it is also used later during measurement of $C_{hand}$. Alternately, if the passive closed measurement is used during calibration, it is also used later during measurement of $C_{hand}$. The measurement results include $C_{all\_A\_0}$ and $C_{all\_PO\_0}$ or $C_{all\_PC\_0}$ depending the type of passive calibration and measurement.

If the passive open mode is used, then the following calculations are made:

$$C_{sensor\_body\_0} = 2*(C_{all\_PO\_0} - C_{ECU}) \quad (1)$$

and $$P_s = \frac{C_{all\_PO\_0} - C_{ECU}}{C_{all\_PO\_0} + C_{all\_A\_0} - 2*C_{ECU}} \quad (2)$$

Where $P_S$ (or $P_{shield}$, is P a shielding parameter, which is described further below.

If the passive closed mode is used, then the following calculations are made:

$$C_{sensor\_shield\_0} = 2*P_s*(C_{all\_PC\_0} - C_{ECU}) \quad (3)$$

and $$P_s = \frac{C_{all\_PC\_0} - C_{all\_A\_0}}{C_{all\_PC\_0} - C_{ECU}} \quad (4)$$

The calculations are used during the capacitance measurement $C_{hand}$ as will described further below.

Figure 16:
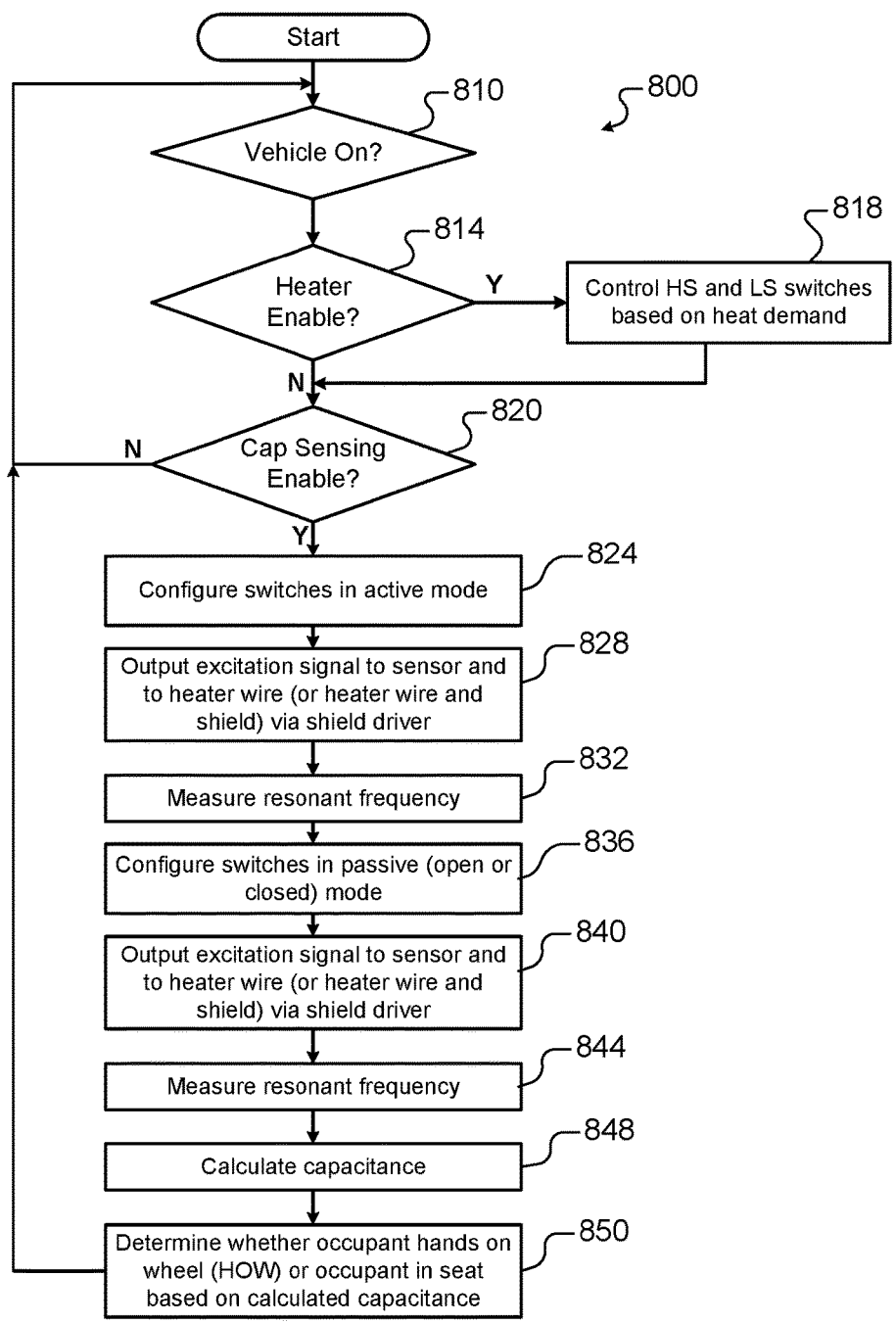
FIG. 16 is a flowchart of an example of a method for sensing capacitance.

Referring now to FIG. 16, a method 800 for operating a capacitive sensing and heating system according to the present disclosure is shown. At 810, the method determines whether the vehicle is ON. In some examples, the vehicle is ON when an ignition switch or other switch is ON, however other criteria may be used. At 814, the method determines whether heating is enabled. If 814 is true, HS and LS switches are controlled based on heat demand at 818 and the method continues at 820.

At 820, the method determines whether capacitive sensing is enabled. If 820 is false, the method returns to 810. If 820 is true, the method continues at 824 and the switches are configured in the active mode. At 828, the excitation signal is output. At 832, the resonant frequency is measured. Additional processing may optionally be performed. At 836, the switches are configured in a passive open mode or a passive closed mode. At 840, an excitation signal is output. At 844, the resonant frequency is measured.

At 848, a capacitance is measured. At 850, the method determines whether or not an object such as a hand is in the vicinity of the steering wheel based on the measured capacitances. In some examples, calculations are made using the measured capacitances to determine $C_{hand}$ and $C_{hand}$ is compared to a threshold.

The capacitance of a body part or object (such as $C_{hand}$) can be calculated using the active mode and the passive mode. The instantaneous value of $C_{hand}$ is derived from the instantaneous active measurement results $C_{all\_A}$ and $C_{all\_PO}$ or $C_{all\_PC}$ and from the corresponding calibration results $C_{all\_A\_0}$ and $C_{all\_PO\_0}$ or $C_{all\_PC\_0}$ described above.

As will be described further below, there are at least two approaches for calculating $C_{hand}$. In a first approach, during the sensor calibration:

$$C_{hand} = 2*(C_{all\_A} - C_{all\_A\_0}) \tag{5}$$

The $C_{hand}$ value is zero when no object is in the vicinity of the steering wheel surface. When the steering wheel is touched, the actual value of $C_{all\_A}$ includes the additional capacitance value of $C_{hand}$ (while $C_{all\_A\_0}$ does not). Therefore, equation (5) can be used to determine the $C_{hand}$ value. Once the value of $C_{hand}$ is determined, it can be compared to a predetermined threshold. If $C_{hand}$ is greater than the predetermined threshold, a "hands-on" state is reported.

In some examples, the value of $C_{hand}$ is compensated for the shift caused by temperature changes in the steering wheel sensor. If calibration was performed using the passive open mode, then:

$$C_{sensor\_body} = 2*(C_{all\_PO} - C_{ECU}) \tag{6}$$

$$\Delta C_{res} = \frac{1 - P_s}{2*P_s} * (C_{sensor\_body} - C_{sensor\_body\_0}) \tag{7}$$

The value of $C_{sensor\_body\_0}$ was determined previously during the steering wheel calibration step by the passive open measurement setup.

If calibration was performed using the passive closed mode:

$$C_{sensor\_shield} = 2*P_s*(C_{all\_PC} - C_{ECU}) \tag{8}$$

$$\Delta C_{res} = \frac{1 - P_s}{2*P_s} * (C_{sensor\_shield} - C_{sensor\_shield\_0}) \tag{9}$$

The value of $C_{sensor\_shield\_0}$ was determined during the steering wheel calibration step by the passive closed measurement setup.

To incorporate compensation into the calculation, the $C_{hand}$ value can be modified by $\Delta C_{res}$ and a tuning coefficient K that fine tunes the compensation for a given steering wheel sensor:

$$C_{hand\_comp} = C_{hand} K * \Delta C_{res} \tag{10}$$

In a second approach, two equations are established based on the active and passive closed modes. There are three unknown capacitance values including $C_{hand}$, $C_{sensor\_shield}$ and $C_{sensor\_body}$, so a third measurement is performed. The third measurement can be the determination of a ratio between the two capacitors in the wheel sensor ($C_{sensor\_shield}$ and $C_{sensor\_body}$) during the calibration phase. The ratio (called shielding parameter $P_S$ or $P_{shield}$) is a constant value that depends on the shield material and the physical dimensions of the wheel sensor layers.

In some examples, the shielding parameter $P_S$ is defined such that an ideal shield has a unity $P_{shield}$ value ($P_{shield}=1$).

$$P_{shield} = \frac{C_{sensor-shield}}{C_{sensor-shield} + C_{sensor-body}} \tag{11}$$

If $P_{shield}$ is equal to 1, then:

$$C_{sensor-body} = 0$$

In other words, when $P_{shield}=1$, the shield layer entirely covers the grounded metal body of the steering wheel and there is no capacitance between the sensor and the grounded body in the active mode measurement.

The calculation of $P_{shield}$ (or $P_S$) from the active and passive mode results during calibration are shown above. In this approach, the calculation for $P_{shield}$ (or $P_S$) is used below but the calculation for $C_{sensor-body\_0}$ is not.

The value of $C_{sensor-body}$ can be expressed from equation (11) as a function of $C_{sensor-shield}$ and $P_{shield}$ as follows:

$$C_{sensor-body} = C_{sensor-shield} * \frac{1 - P_{shield}}{P_{shield}} \tag{12}$$

Now there are only two unknown variables ($C_{sensor-shield}$ and $C_{hand}$) and two equations. By solving for $C_{hand}$ just after each double measurement, the $C_{hand}$ actual value can be calculated as follows:

$$C_{all\_A} = C_{ECU} + C_{sensor-shield} * \frac{1 - P_s}{2*P_s} + \frac{1}{2} * C_{hand} \tag{13}$$

$$C_{all\_PC} = C_{ECU} + C_{sensor-shield} * \frac{1}{2*P_s} + \frac{1}{2} * C_{hand} \tag{14}$$

To solve for $C_{hand}$ using (13) and (14), both equations are rearranged to isolate $C_{sensor\_shield}$.

$$C_{sensor-shield} = \frac{2*P_s*C_{all\_A} - 2*P_s*C_{ECU} - P_s*C_{hand}}{1 - P_s} \tag{15}$$

$$C_{sensor-shield} = 2*P_s*C_{all\_PC} - 2*P_s*C_E - P_s*C_{hand} \tag{16}$$

$C_{sensor-shield}$ can then be eliminated by setting the two equations equal to one another as shown below:

$$\frac{2*P_s*C_{all\_A} - 2*P_s*C_{ECU} - P_s*C_{hand}}{1 - P_s} = \tag{17}$$
$$2*P_s*C_{all\_PC} - 2*P_s*C_E - P_s*C_{hand}$$

From this equation, we can solve for $C_{hand}$:

$$C_{hand} = 2 * \frac{C_{all\_PC}*(P_s - 1) - P_s*C_{ECU} + C_{all\_A}}{P_s} \tag{18}$$

This calculation relies on the actual value of the $C_{sensor-shield}$. Therefore, there is no need for any further compensation and there is no signal reduction in this solution for a certain $C_{hand}$ value.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A capacitance measuring system for detecting an occupant of a vehicle, comprising:
a sensor/heater assembly arranged in at least one of a seat or a steering wheel of a vehicle and including:
a sensor; and
a heater arranged adjacent to the sensor; and
a measurement circuit configured to:
output an excitation signal to the measurement circuit and the sensor/heater assembly;
measure a resonant frequency of the measurement circuit and the sensor/heater assembly in response to the excitation signal;
determine at least one capacitance value based on the resonant frequency; and
determine whether a body part is in proximity to the sensor based on the at least one capacitance value;
wherein the measurement circuit includes:
an LC tank circuit;
an excitation circuit in communication with the LC tank circuit and configured to generate the excitation signal that is output to the LC tank circuit;
a frequency measurement circuit in communication with the LC tank circuit and configured to measure the resonant frequency in response to the excitation signal; and
a controller configured to:
trigger the excitation signal;
receive the resonant frequency;
determine the capacitance value based on the resonant frequency; and
determine whether the body part is in proximity to the sensor based on the capacitance value.

2. The capacitance measuring system of claim 1, wherein:
the sensor/heater assembly includes a substrate;
the sensor is arranged on one surface of the substrate; and
the heater is arranged on an opposite surface of the substrate.

3. The capacitance measuring system of claim 2, wherein the substrate comprises a material selected from a group consisting of foam, felt, woven fabric and knitted fabric.

4. The capacitance measuring system of claim 2, wherein the sensor comprises a first wire arranged in a first predetermined pattern on the one surface of the substrate.

5. The capacitance measuring system of claim 4, wherein the heater comprises a second wire arranged in a second predetermined pattern on the opposite surface of the substrate.

6. The capacitive measuring system of claim 5, wherein the second wire in the second predetermined pattern has a spacing with a maximum distance that is less than or equal to 4 mm.

7. The capacitance measuring system of claim 6, wherein the maximum distance is less than or equal to 3 mm.

8. The capacitance measuring system of claim 6, wherein the maximum distance is less than or equal to 2 mm.

9. A capacitive measuring system for detecting an occupant of a vehicle, comprising:
a sensor/heater assembly arranged in at least one of a seat or a steering wheel of a vehicle and including:
a sensor; and
a heater arranged adjacent to the sensor; and
a measurement circuit configured to:
output an excitation signal to the measurement circuit and the sensor/heater assembly;
measure a resonant frequency of the measurement circuit and the sensor/heater assembly in response to the excitation signal;
determine at least one capacitance value based on the resonant frequency; and
determine whether a body part is in proximity to the sensor based on the at least one capacitance value;
wherein:
the sensor/heater assembly includes a substrate;
the sensor is arranged on one surface of the substrate; and
the heater is arranged on an opposite surface of the substrate;
wherein the sensor comprises a first wire arranged in a first predetermined pattern on the one surface of the substrate;
wherein the heater comprises a second wire arranged in a second predetermined pattern on the opposite surface of the substrate; and
non-conductive thread attaching at least one of the sensor and the heater to the substrate.

10. The capacitance measuring system of claim 1, further comprising:
a driver circuit arranged between the LC tank circuit and the heater and configured to drive the heater in response to the excitation signal.

11. The capacitance measuring system of claim 10, further comprising a shield layer arranged adjacent to the heater.

12. The capacitance measuring system of claim 11, wherein the shield layer is connected by a capacitor to the heater and the driver circuit.

13. The capacitance measuring system of claim 1, wherein the measurement circuit includes:
a driver circuit including:
a high side switch configured to selectively connect one end of the heater to a voltage reference; and
a low side switch configured to selectively connect another end of the heater to a reference potential; and
a driver switch configured to selectively connect the driver circuit to the heater.

14. The capacitance measuring system of claim 13, wherein the controller configures states of the high side switch, the low side switch and the driver switch in (i) an active mode and (ii) at least one of a passive open mode and a passive closed mode during both calibration and measurement of the capacitance value.

15. The capacitance measuring system of claim 14, wherein, during the active mode, the controller configures the high side switch and the low side switch in open states and the driver switch in a closed state.

16. The capacitance measuring system of claim 14, wherein, during the passive closed mode, the controller configures the high side switch and the driver switch in an open state and the low side switch in a closed state.

17. The capacitance measuring system of claim 14, wherein, during the passive open mode, the controller configures the high side switch, the driver switch and the low side switch in open states.

18. The capacitance measuring system of claim 10, wherein the controller is configured to operate in a first calibration mode, a second calibration mode and a measurement mode.

19. The capacitance measuring system of claim 18, wherein the controller is configured to determine a first capacitance value during the first calibration mode based on a capacitance of the capacitance measuring system without the heater and a capacitance sensing layer attached thereto.

20. The capacitance measuring system of claim 18, wherein the controller is configured to operate in the second calibration mode one time and to operate in the measurement mode a plurality of times.

* * * * *

UNITED STATES PATENT AND TRADEMARK OFFICE
CERTIFICATE OF CORRECTION

PATENT NO. : 10,969,248 B2
APPLICATION NO. : 16/256078
DATED : April 6, 2021
INVENTOR(S) : Robert Lakatos et al.

It is certified that error appears in the above-identified patent and that said Letters Patent is hereby corrected as shown below:

On the Title Page

Item [73], Delete "Inc." and insert --Incorporated--

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*